US012575396B2

(12) United States Patent
Huang et al.

(10) Patent No.: US 12,575,396 B2
(45) Date of Patent: Mar. 10, 2026

(54) ELECTRONIC DEVICE INCLUDING A CONDUCTIVE PAD AND A FLOATING PAD WITH A METAL FRAME OUTLINING AN OBSERVATION REGION

(71) Applicant: InnoLux Corporation, Miao-Li County (TW)

(72) Inventors: Yu-Chia Huang, Miao-Li County (TW); Mei-Chi Hsu, Miao-Li County (TW); Chung-Wen Yen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 463 days.

(21) Appl. No.: 18/183,341

(22) Filed: Mar. 14, 2023

(65) Prior Publication Data

US 2023/0215782 A1 Jul. 6, 2023

(30) Foreign Application Priority Data

Apr. 13, 2022 (CN) .......................... 202210385926.1

(51) Int. Cl.
H01L 23/485 (2006.01)
H01L 21/66 (2006.01)
H01L 23/48 (2006.01)
H01L 23/498 (2006.01)
H10D 86/40 (2025.01)

(52) U.S. Cl.
CPC .......... H01L 23/485 (2013.01); H01L 23/481 (2013.01)

(58) Field of Classification Search
CPC ..... H01L 23/485; H01L 23/481; H01L 22/32; H01L 23/49838; H10D 86/441; H10D 86/60
See application file for complete search history.

(56) References Cited

U.S. PATENT DOCUMENTS

| | | | | |
|---|---|---|---|---|
| 4,751,458 A | | 6/1988 | Elward | |
| 5,773,875 A | * | 6/1998 | Chan ................. | H01L 23/49888 505/703 |
| 2005/0099565 A1 | | 5/2005 | Shin et al. | |
| 2007/0052344 A1 | | 3/2007 | Wen et al. | |
| 2011/0204515 A1 | * | 8/2011 | Fazelpour ............... | H01L 24/11 257/E21.59 |
| 2014/0203397 A1 | * | 7/2014 | Yen ...................... | H01L 23/5227 438/381 |
| 2014/0246790 A1 | * | 9/2014 | Haney .................... | H01L 24/06 438/106 |
| 2014/0264837 A1 | * | 9/2014 | Chen ...................... | H01L 24/94 257/737 |

* cited by examiner

*Primary Examiner* — Herve-Louis Y Assouman

(74) *Attorney, Agent, or Firm* — McClure, Qualey & Rodack, LLP

(57) ABSTRACT

An electronic device is provided. The electronic device includes a substrate, a first conductive pad and a floating pad. The first conductive pad is disposed on the substrate. The floating pad is disposed on the substrate and adjacent to the first conductive pad. The floating pad includes a metal frame, and an inner edge of the metal frame defines an outline of an observation region. In addition, in a bottom-view diagram of the electronic device, the outline of the observation region has at least one arc-shaped edge.

19 Claims, 12 Drawing Sheets

ELECTRONIC DEVICE INCLUDING A CONDUCTIVE PAD AND A FLOATING PAD WITH A METAL FRAME OUTLINING AN OBSERVATION REGION

CROSS REFERENCE TO RELATED APPLICATIONS

This application claims the benefit of China Application No. 202210385926.1, filed Apr. 13, 2022, the entirety of which is incorporated by reference herein.

BACKGROUND

Technical Field

The present disclosure is related to an electronic device, and in particular it is related to an electronic device including a conductive pad and a floating pad.

Description of the Related Art

With the rapid development of electronic products, consumers have high expectations regarding the quality, functionality, or price of these products.

The circuit substrate and the electronic components in the electronic device are usually electrically connected by conductive pads, conductive glue, or some other conductive element. The conductive particles in the conductive glue need to be pressed by an appropriate amount of force to be conductive. Generally, it is possible to determine whether the force is appropriate by observing the shape of the conductive particles after being pressed, and then to determine the bonding status between the circuit substrate and the electronic components. However, since the conductive glue is located between the solid conductive pad and the electronic component, it is difficult to discern the condition of the pressed conductive particles through only direct observation.

In order to improve the performance of electronic devices, developing a structural design that can improve the electrical connection quality of bonding components is still one of the current research topics in the industry.

SUMMARY

In accordance with some embodiments of the present disclosure, an electronic device is provided. The electronic device includes a substrate, a first conductive pad and a floating pad. The first conductive pad is disposed on the substrate. The floating pad is disposed on the substrate and adjacent to the first conductive pad. The floating pad includes a metal frame, and an inner edge of the metal frame defines an outline of an observation region. In addition, in a bottom-view diagram of the electronic device, the outline of the observation region has at least one arc-shaped edge.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
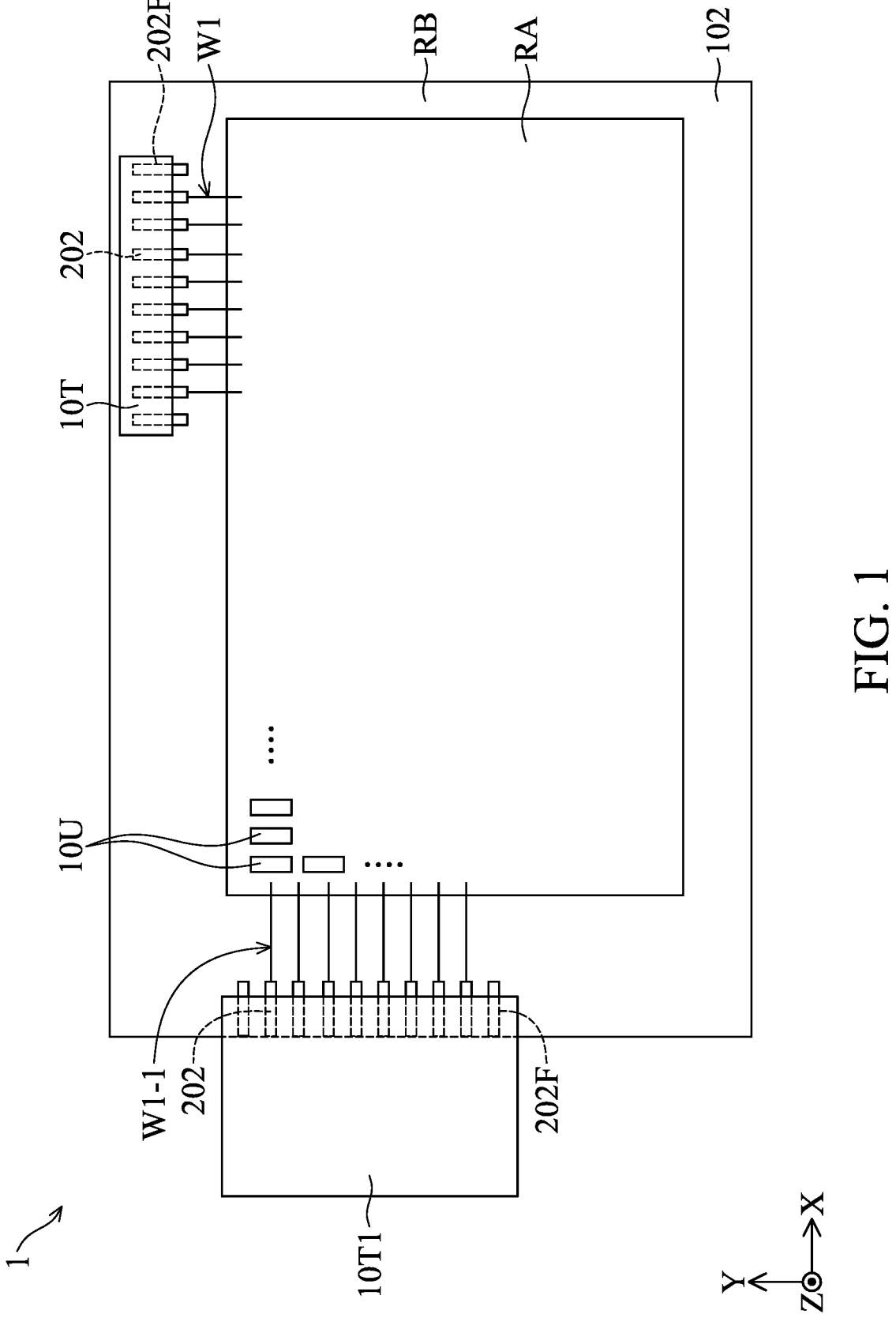
FIG. 1 is a top-view diagram of an electronic device in accordance with some embodiments of the present disclosure.

The electronic device according to the present disclosure is described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on or over a second material layer" may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on or over the second material layer" means that the first material layer is in direct contact with the second material layer, and there is no intermediate element or layer between the first material layer and the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "electrically coupled to" may include any direct or indirect electrical connection means.

In the following descriptions, terms "about" and "substantially" typically mean+/−10% of the stated value, or typically +/−5% of the stated value, or typically +/−3% of the stated value, or typically +/−2% of the stated value, or typically +/−1% of the stated value or typically +/−0.5% of the stated value. The expression "in a range from the first value to the second value" or "between the first value and the second value" means that the range includes the first value, the second value, and other values in between. In addition, certain errors may exist between any two values or directions used for comparison. If the first value is equal to the second value, it implies that there may be a 10% error between the first value and the second value; if the first direction is perpendicular to the second direction, the angle between the first direction and the second direction may be between 80 degrees and 100 degrees; if the first direction is parallel to the second direction, the angle between the first direction and the second direction may be between 0 degrees and 10 degrees.

Throughout the present disclosure and the appended claims, certain terms are used to refer to specific elements.

Those skilled in the art should understand that electronic device manufacturers may refer to the same element with different names. The present disclosure does not intend to distinguish between elements that have the same function but different names. In the specification and claims, the terms "comprising", "including", "having" and the like are open-ended phrases, so they should be interpreted as "including but is not limited to . . . ". Therefore, when the terms "comprising", "including" and/or "having" are used in the description of the present disclosure, they specify the corresponding features, regions, steps, operations and/or components, but do not exclude the existence of one or more corresponding features, regions, steps, operations and/or components.

It should be understood that in the following embodiments, without departing from the spirit of the present disclosure, the features in several different embodiments can be replaced, recombined, and mixed to complete another embodiment. The features between various embodiments can be arranged and combined arbitrarily as long as they do not violate or conflict the spirit of the present disclosure.

Moreover, the electronic device of the present disclosure may include a display device, a backlight device, an antenna device, a sensing device, a tiled device, a touch display, a curved display, or a free-shape display, but it is not limited thereto. The electronic device may include, for example, liquid crystal, light-emitting diode, fluorescence, phosphor, another suitable display medium, or a combination thereof, but it is not limited thereto. The display device can be a non-self-luminous display device or a self-luminous display device. The antenna device may be a liquid-crystal antenna device or a non-liquid-crystal antenna device. The sensing device may be a sensing device for sensing capacitance, light, heat or ultrasonic waves, but it is not limited thereto. The electronic device may include an electronic component, and the electronic component may include passive components and active components, for example, capacitors, resistors, inductors, diodes, transistors, and so on. The diodes may include light-emitting diodes (LEDs), or photodiodes. The light-emitting diodes may include organic light-emitting diodes (OLEDs), mini light-emitting diodes (mini-LEDs), micro light-emitting diodes (micro-LEDs) or quantum dot light-emitting diodes (QLEDs, QDLEDs), but they are not limited thereto. In addition, the electronic device can be a bendable or flexible electronic device. It should be noted that, the electronic device can be any permutation and combination of the aforementioned, but it is not limited thereto. Moreover, the electronic device can be a bendable or flexible electronic device. In addition, the shape of the electronic device can be rectangular, circular, polygonal, with curved edges, or other suitable shapes. The electronic device may have peripheral systems such as a driving system, a control system, a light source system, a shelf system, etc. to support a display device, an antenna device or a tiled device.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with the embodiments of the present disclosure, an electronic device is provided, including a floating pad disposed adjacent to a conductive pad. The floating pad has an observation region. By observing the observation region of the floating pad, the bonding process status or other characteristics of the adjacent conductive pad and the electronic component can be known. For example, the uniformity, integrity, or roughness, of the surface of the insulating layer on the substrate, or the degree of deformation of the conductive particles, or whether there are bubbles in the conductive glue, etc. can be determined. In this way, the yield of the bonding process can be effectively improved.

The electronic device of the present disclosure may include a display device, a backlight device, a touch device, a sensing device, an antenna device or a tiled device (a tiled device having any of the above functions or combined functions), but it is not limited thereto. The electronic device may include a bendable or flexible electronic device, but it is not limited thereto. The antenna device may be a liquid-crystal antenna device or a non-liquid-crystal antenna device. The sensing device may be a sensing device for sensing capacitance, light, heat or ultrasonic waves, but it is not limited thereto. The electronic device may include, for example, liquid crystal, quantum dot (QD), fluorescence, phosphor, another suitable material, or a combination thereof, but it is not limited thereto. In accordance with some embodiments, the electronic device may include an electronic component, and the electronic component may include passive components and active components, for example, capacitors, resistors, inductors, diodes, transistors, or a combination thereof, but they are not limited thereto. The diodes may include organic light-emitting diodes (OLEDs), mini light-emitting diodes (mini-LEDs), micro light-emitting diodes (micro-LEDs) or quantum dot light-emitting diodes (QLEDs, QDLEDs), but they are not limited thereto. In accordance with some embodiments, the electronic device may include a panel and/or a backlight module. The panel may include, for example, a liquid-crystal panel or another self-luminous panel, but it is not limited thereto. It should be understood that the electronic device of the present disclosure will be described below by taking a display device as an example, but the present disclosure is not limited thereto.

Please refer to FIG. 1, which is a top-view diagram of an electronic device 1 in accordance with some embodiments of the present disclosure. For clarity, some elements of the electronic device 1 are omitted in the figure, and only some elements are schematically shown. In accordance with some embodiments, additional features may be added to the electronic device 1 described below. In accordance with some other embodiments, some features of the electronic device 1 described below may be replaced or omitted.

The electronic device 1 may include a substrate 102. The substrate 102 may have an operation area RA and a peripheral area RB, and the peripheral area RB may be adjacent to at least one side of the operation area RA. For example, the peripheral area RB may surround the operation area RA. In accordance with some embodiments, the operation area RA may be different according to the application of the electronic device 1. For example, the operation area RA may include a display area, a detection area, a touch area, another suitable application area, or a combination thereof, and the peripheral area RB may be other areas other than the operation area RA. In accordance with some embodiments, the electronic device 1 may include an electronic unit 10U, an electronic component (such as an electronic component 10T and/or an electronic component 10T1) and/or a connection structure (such as a conductive pad 202, a wire W1 and/or a wire W1-1). The electronic unit 10U, the electronic component (such as the electronic component 10T and/or the electronic component 10T1) and the connection structure (such as the conductive pad 202, the wire W1 and/or the wire W1-1) may be disposed on the substrate 102. The electronic unit 10U may be disposed in the operation area RA, and the electronic component 10T and/or the electronic component 10T1 may be disposed in the peripheral area RB. The electronic unit 10U and the electronic component 10T may be electrically connected through the conductive pad 202 and the wire W1, and the electronic unit 10U and the electronic component 10T1 may be electrically connected through the conductive pad 202 and the wire W1-1. The electronic component 10T and/or the electronic component 10T1 may be used to control the electronic unit 10U. In accordance with some embodiments, the wire W1 (or the wire W1-1) may extend from the peripheral area RB into the operation area RA and be electrically connected to the electronic unit 10U, but it is not limited thereto.

In accordance with some embodiments, the electronic component 10T and/or the electronic component 10T1 may include, for example, an integrated circuit (IC), a microchip, a flexible printed circuit board (FPC) or another suitable electronic component, but it is not limited thereto. In accordance with some embodiments, the electronic components may be disposed on the substrate 102 in the form of chip on film (COF), chip on glass (COG), etc., but it is not limited thereto. In accordance with some embodiments, the electronic device 1 may include a plurality of electronic components, and these electronic components may be located in the peripheral area RB and adjacent to the same side or different sides of the operation area RA. As shown in FIG. 1, two electronic components (for example, the electronic component 10T and the electronic component 10T1) may be located in the peripheral area RB and respectively adjacent to two sides of the operation area RA, but it is not limited thereto. The configurations of the different electronic components can be adjusted according to needs. In accordance with some embodiments, the electronic component 10T and the electronic component 10T1 may be used to transmit different signals (such as scan signals or data signals), respectively, but they are not limited thereto. It should be understood that the quantity or arrangement of the electronic units 10U and electronic components is not limited to those shown in the drawings.

In accordance with some embodiments, the wire W1 (or the wire W1-1) may have a single-layer structure or a composite-layer structure. The electronic component 10T and/or the electronic component 10T1 may have bonding pads, and these bonding pads may be electrically connected to the conductive pads 202 respectively. In accordance with some embodiments, in a normal direction Z of the substrate 102, the conductive pad 202 may at least partially overlap with the bonding pad (not illustrated) of the electronic component.

In accordance with some embodiments, the electronic unit 10U may be a sub-pixel, and the sub-pixel may include at least one thin-film transistor (TFT). The thin-film transistor may include a switching transistor, a driving transistor, a reset transistor, or another suitable transistor, but it is not limited thereto. In accordance with some embodiments, the substrate 102 may include a rigid substrate or a flexible substrate. In accordance with some embodiments, the substrate 102 may include glass, quartz, ceramic, sapphire, polyimide (PI), polycarbonate (PC), polyethylene terephthalate (PET), another suitable material or a combination of the aforementioned materials, but it is not limited thereto.

Figure 2:
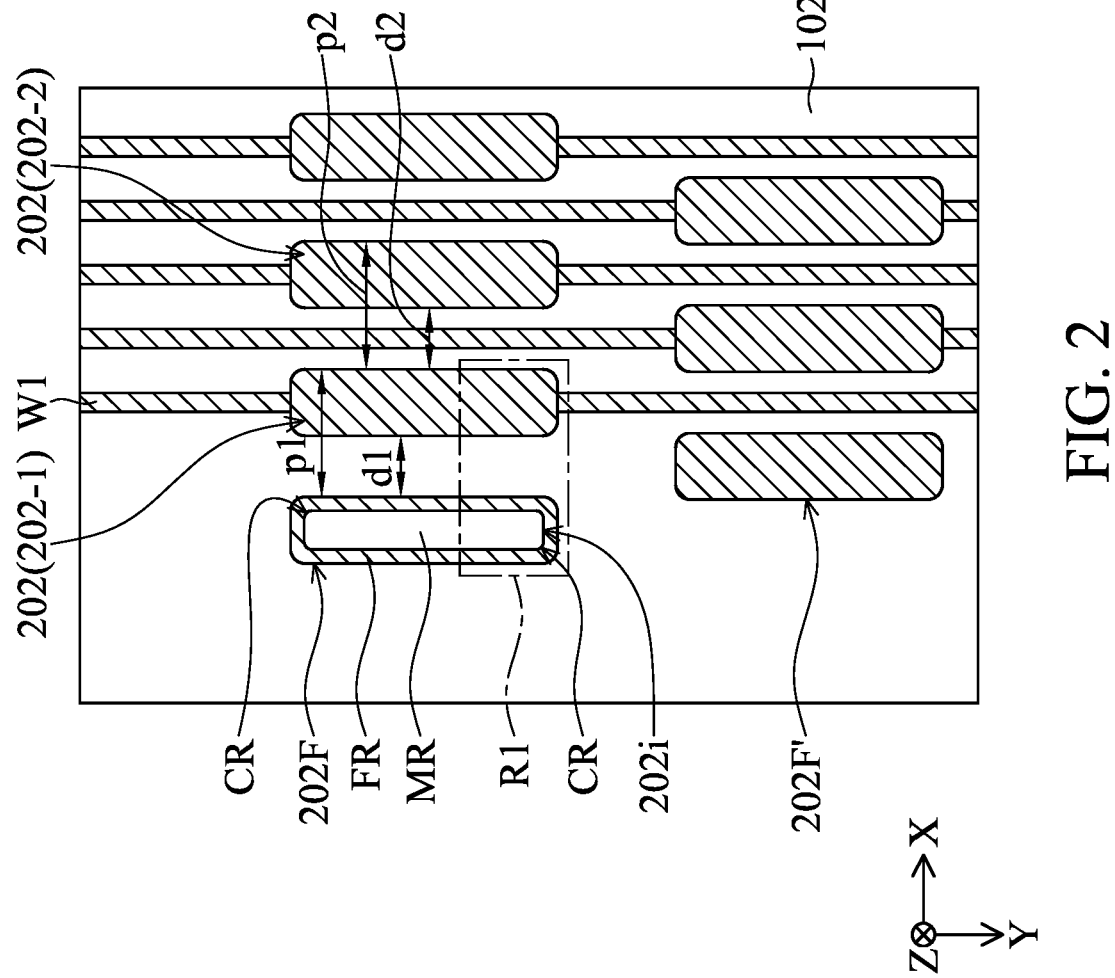
FIG. 2 is a bottom-view diagram of some components of an electronic device in accordance with some embodiments of the present disclosure.

Please refer to FIG. 2, which is a bottom-view diagram of some components of the electronic device 1 in accordance with some embodiments of the present disclosure. FIG. 2 shows a schematic structural diagram of the conductive pads 202, the floating pads 202F and/or the wires W1 in a partial area of the electronic device 1 viewed from the backside of the substrate 102 (e.g., the side where the conductive pads 202 are not provided).

The electronic device 1 may include a plurality of conductive pads 202 and at least one floating pad 202F, and the plurality of conductive pads 202 and at least one floating pad 202F may be disposed on the substrate 102. As shown in FIG. 2, the plurality of conductive pads 202 may include a first conductive pad 202-1 and a second conductive pad 202-2. The floating pad 202F may be disposed on the substrate 102 and adjacent to the first conductive pad 202-1, and the first conductive pad 202-1 may be, for example, located between the second conductive pad 202-2 and the floating pad 202F. The floating pad 202F may include a metal frame FR, and an inner edge 202i of the metal frame FR may substantially define an outline of an observation region MR. In the bottom-view diagram (for example, the X-Y plane) of the electronic device 1, the outline of the observation region MR may have at least one arc-shaped edge CR. In other words, the inner edge 202i of the metal frame FR may have a curved edge. In accordance with some embodiments, the plurality of conductive pads 202 and the floating pad 202F may be located in the peripheral area RB, and these conductive pads 202 may be electrically connected to the wires W1 for transmitting signals (e.g., scan signals or data signals), and the floating pad 202F may be not electrically connected to the wire W1.

In accordance with some embodiments, the plurality of conductive pads 202 may have a long axis extending along a second direction Y and a short axis extending along a first direction X. In accordance with some embodiments, the first direction X and the second direction Y may be substantially perpendicular to each other. In accordance with some embodiments, the outline of the conductive pad 202 may have arc-shaped edges. According to different embodiments, the conductive pad 202 may have another suitable shape.

In accordance with some embodiments, the conductive pad 202 may include a conductive material, such as metal or alloy, but it is not limited thereto. The conductive pad 202 may have a single-layer or multi-layer structure, and the materials of the multi-layer structure may be the same or different. The metal material may include copper (Cu), aluminum (Al), molybdenum (Mo), indium (In), tin (Sn), gold (Au), zinc (Zn), silver (Ag), titanium (Ti), lead (Pb), nickel (Ni), another suitable conductive material or a combination thereof, but it is not limited thereto.

As described above, the floating pad 202F may have a metal frame FR and an observation region MR defined by the metal frame FR. The metal frame FR may be a hollow structure, and the observation region MR may be a light-transmitting region. The aforementioned light-transmitting region refers to, for example, a region where the light transmittance of light of the visible-light wavelength is greater than or equal to 50%. As shown in FIG. 2, in accordance with some embodiments, the metal frame FR may be a continuous structure, that is, the metal frame FR are not divided into several segments. In accordance with some embodiments, the outline of the observation region MR may have a plurality of arc-shaped edges CR. In accordance with some embodiments, the radius of curvature of the arc-shaped edge CR of the outline of the observation region MR may be between 1 micrometer (μm) and 100 micrometers (i.e. 1 μm≤curvature radius≤100 μm), between 1 micrometer and 10 micrometers (That is, 1 μm≤radius of curvature≤10 μm), or between 1 μm and 7 μm (i.e. 1 μm≤radius of curvature≤7 μm), or between 1 μm and 4 μm (i.e. 1 μm≤radius of curvature≤4 μm), such as 1.5 μm, 2 μm, 2.5 μm, 3 μm or 3.5 μm.

Figure 5:
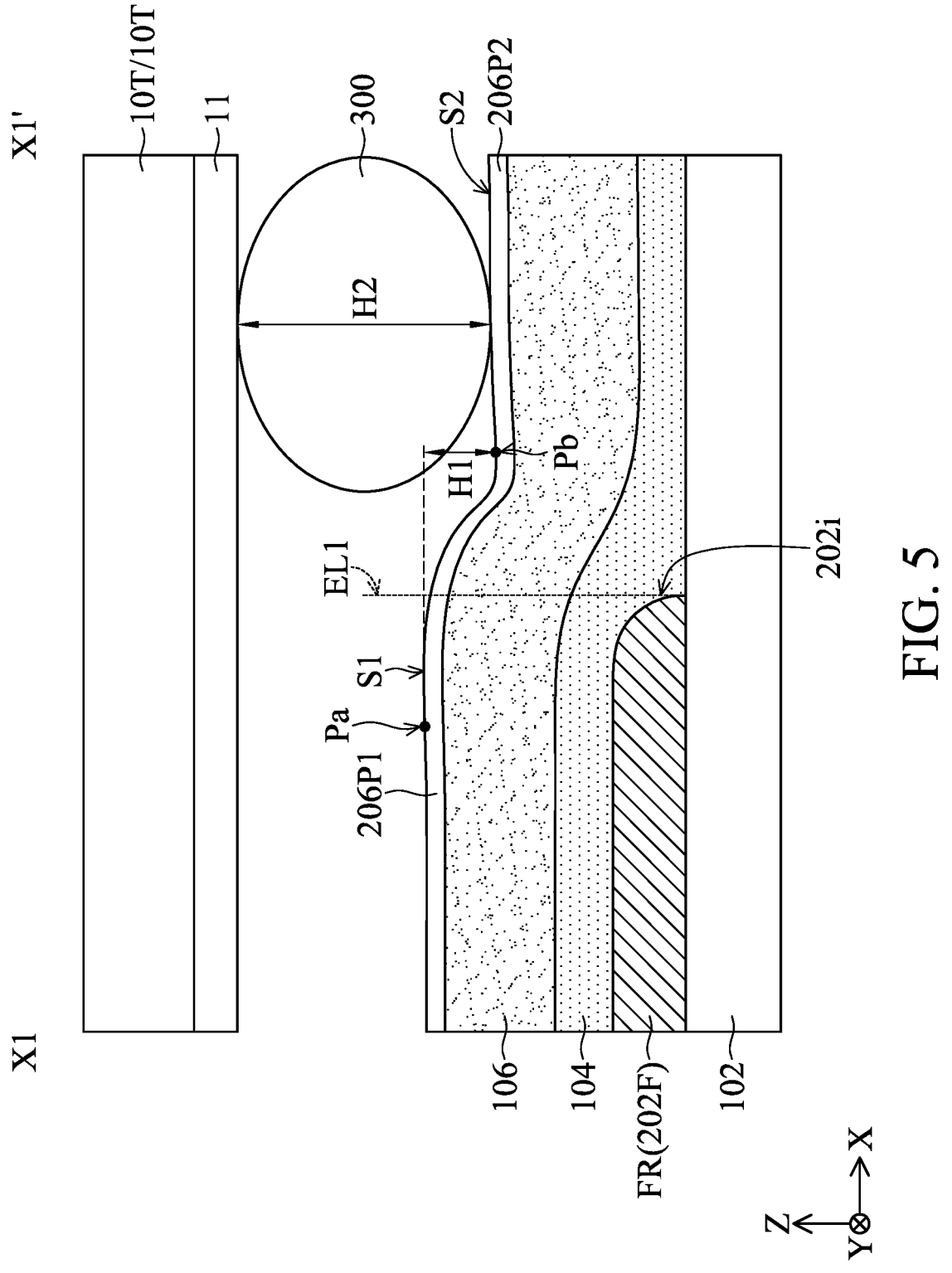
FIG. 5 is a cross-sectional diagram of an electronic device corresponding to the section line X1-X1' in FIG. 3 in accordance with some embodiments of the present disclosure.

It should be noted that the floating pad 202F can be adjacent to the conductive pad 202 bonded to the electronic component (such as the electronic component 10T and the electronic component 10T1), and the bonding process status of the adjacent conductive pad 202 and the electronic component can be indirectly determined by the observation region MR. For example, the degree of deformation or fragmentation of the conductive particles 300 (as shown in FIG. 5) in the conductive glue caused by force can be observed through the observation region MR, so as to determine the electrical connection status between the conductive particles and the conductive pad 202 (or electronic component). In accordance with some embodiments, the steps of the bonding process can be observed in real time through the above method and corresponding adjustments can be made to improve the yield of the bonding process. In accordance with some other embodiments, the observation region MR can be used to observe the uniformity or roughness of the surface of the insulating layer disposed on the substrate 102, or whether there are bubbles in the conductive glue or other characteristics, but it is not limited thereto.

It should be noted that the design of the inner edge 202i of the metal frame FR with the arc-shaped edge CR can reduce the diffraction problem, making the detection in the observation region MR more accurate, thereby improving the yield of the bonding process.

In accordance with some embodiments, at least a part of the metal frame FR and the conductive pad 202 may belong to the same conductive layer. In accordance with some embodiments, the material of the metal frame FR may be the same as or different from that of the conductive pad 202. In accordance with some embodiments, the metal frame FR may have a single-layer or multi-layer structure, and the materials of the multi-layer structure may be the same or different.

In accordance with some embodiments, the electronic device 1 may include a dummy conductive pad 202F', and the dummy conductive pad 202F' may be adjacent to the conductive pad 202. The dummy conductive pad 202F' may have a solid structure, that is, the dummy conductive pad 202F' does not have the observation region MR. In accordance with some embodiments, the dummy conductive pad 202F' is not electrically connected to any wire. In accordance with some embodiments, the material of the dummy conductive pad 202F' may be the same as or different from that of the conductive pad 202 (or the material of the metal frame FR).

It should be understood that the quantity of the conductive pads 202 and the floating pads 202F are not limited to those shown in the drawings. As mentioned above, the plurality of conductive pads 202 include the first conductive pad 202-1 and the second conductive pad 202-2, the first conductive pad 202-1 may be the conductive pad 202 that is closest to the floating pad 202F in the first direction X, and the second conductive pad 202-2 may be the conductive pad 202 that is closest to the first conductive pad 202-1 in the first direction X. As shown in FIG. 2, the second conductive pad 202-2 may be adjacent to the first conductive pad 202-1, and the first conductive pad 202-1 and the second conductive pad 202-2 may be arranged along the first direction X. In accordance with some embodiments, in the first direction X, the distance between the floating pad 202F and the first conductive pad 202-1 is represented by distance d1, the distance between the first conductive pad 202-1 and the second conductive pad 202-2 is represented by distance d2, and the distance d1 and the distance d2 satisfy the following relationship: 0.5≤d1/d2≤1.5. In accordance with some embodiments, the distance d1 and the distance d2 satisfy the following relationship: 0.7≤d1/d2≤1.3, or 0.8≤d1/d2≤1.2, for example, d1/d2 is equal to 0.9, 1.0 or 1.1.

The aforementioned distance d1 refers to the minimum distance between the floating pad 202F and the first conductive pad 202-1 in the direction in which the first conductive pad 202-1 and the second conductive pad 202-2 are arranged (for example, the first direction X). The aforementioned distance d2 refers to the minimum distance between the first conductive pad 202-1 and the second conductive pad 202-2 in the direction in which the first conductive pad 202-1 and the second conductive pad 202-2 are arranged (for example, the first direction X).

It should be noted that when the distance d1 and the distance d2 satisfy the following relationship: 0.5≤d1/d2≤1.5, the floating pad 202F can further reflect the possible bonding process conditions of the conductive pad 202, thereby improving the yield of bonding process.

In accordance with some embodiments, in the first direction X, the pitch between the floating pad 202F and the first conductive pad 202-1 is represented by pitch p1, the pitch between the first conductive pad 202-1 and the second conductive pad 202-2 is represented by pitch p2, and the pitch p1 and the pitch p2 satisfy the following relationship: 0.5≤p1/p2≤1.5. In accordance with some embodiments, the pitch p1 and the pitch p2 satisfy the following relationship: 0.7≤p1/p2≤1.3, or 0.8≤p1/p2≤1.2, for example, p1/p2 is equal to 0.9, 1.0 or 1.1.

The aforementioned pitch p1 refers to the distance between the floating pad 202F and the first conductive pad 202-1 in the direction in which the first conductive pad 202-1 and the second conductive pad 202-2 are arranged (for example, the first direction X). Specifically, the pitch p1 is the distance between the same sides (e.g., the left side or the right side) of the floating pad 202F and the first conductive pad 202-1 or the distance between the centers of the floating pad 202F and the first conductive pad 202-1. The aforementioned pitch p2 refers to the distance between the first conductive pad 202-1 and the second conductive pad 202-2 in the direction in which the first conductive pad 202-1 and the second conductive pad 202-2 are arranged (for example, the first direction X). Specifically, the pitch p2 is the distance between the same sides (e.g., the left side or the right side) of the first conductive pad 202-1 and the second conductive pad 202-2 or the distance between the centers of the first conductive pad 202-1 and the second conductive pad 202-2.

Similarly, when the pitch p1 and the pitch p2 satisfy the following relationship: 0.5≤p1/p2≤1.5, the floating pad 202F can further reflect the possible bonding process conditions of the conductive pad 202, thereby improving yield of bonding process.

It should be understood that, in accordance with the embodiments of the present disclosure, an optical microscope (OM), a scanning electron microscope (SEM), a film thickness profiler (α-step), an ellipsometer or another suitable method may be used to measure the depth, thickness, width, or height of each element, or the spacing or distance between elements. In accordance with some embodiments, a scanning electron microscope may be used to obtain a cross-sectional image including the elements to be measured, and the depth, thickness, width, or height of each element, or the spacing or distance between elements in the image can be measured.

Figure 3:
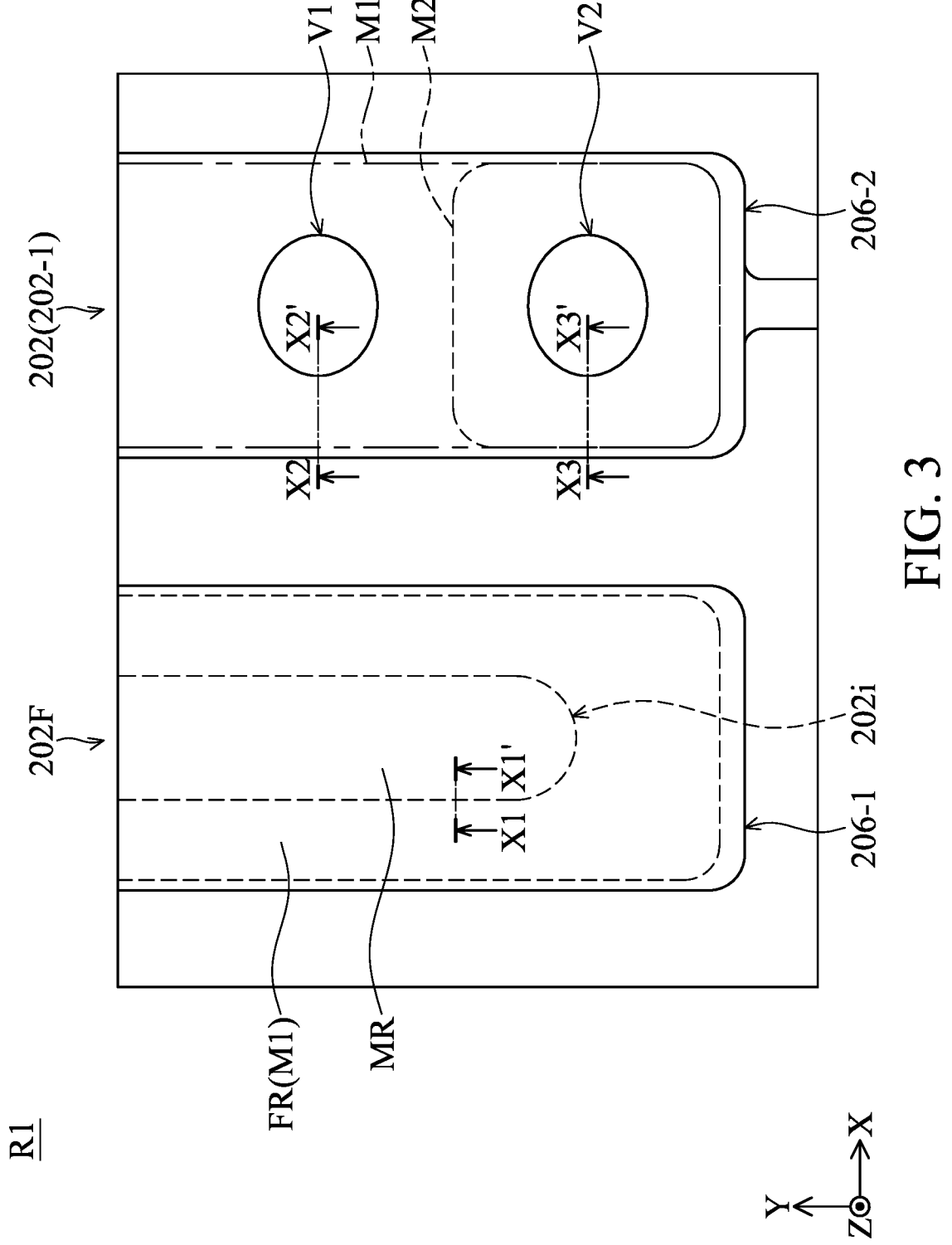
FIG. 3 is an enlarged diagram of the front structure of the region R1 in FIG. 2 in accordance with some embodiments of the present disclosure.
Figure 4:
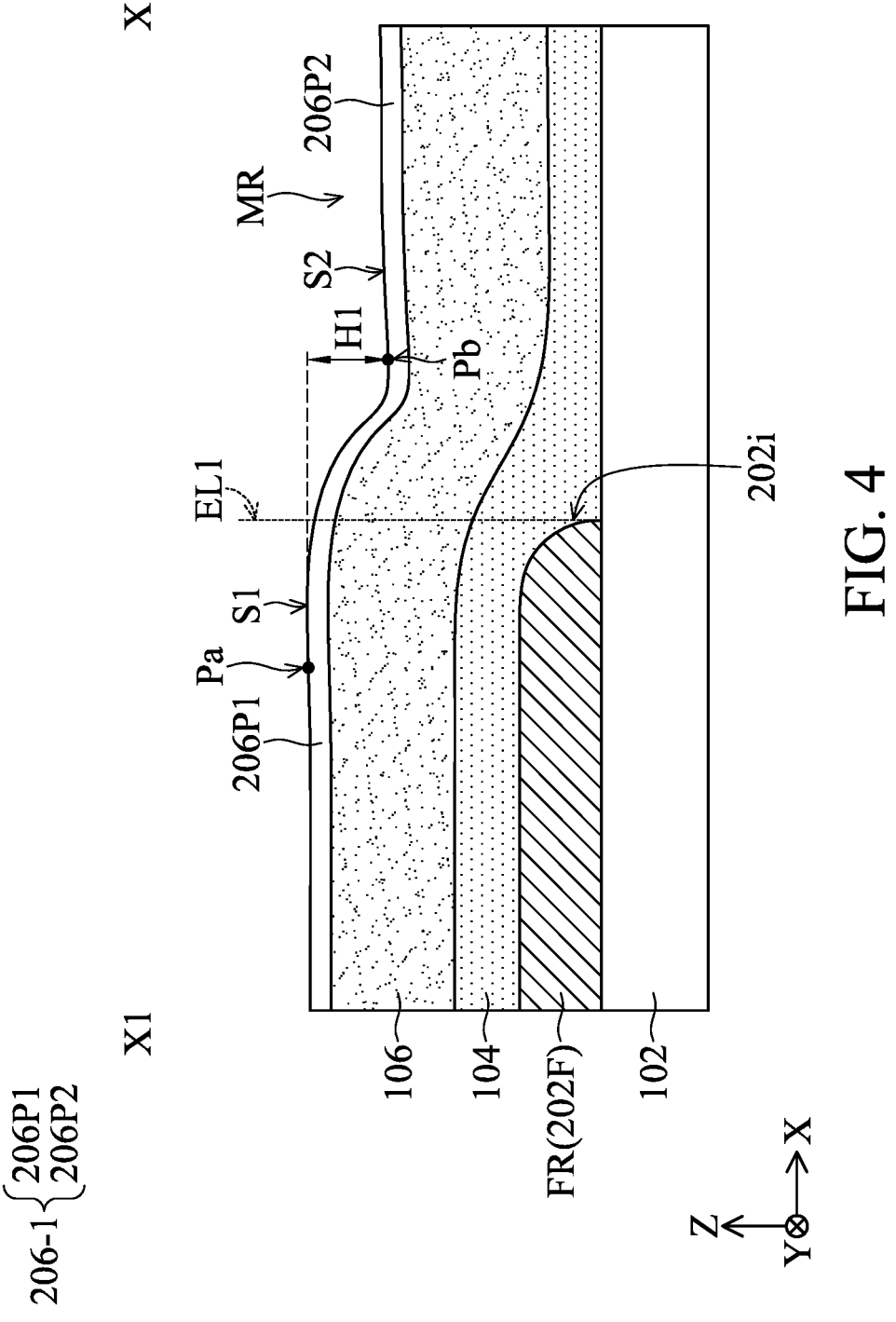
FIG. 4 is a cross-sectional diagram of an electronic device corresponding to the section line X1-X1' in FIG. 3 in accordance with some embodiments of the present disclosure.

Next, please refer to FIG. 3 to FIG. 5. FIG. 3 is an enlarged diagram of the front structure of the region R1 in FIG. 2 in accordance with some embodiments of the present disclosure. FIG. 4 is a cross-sectional diagram of the electronic device 1 corresponding to the section line X1-X1' in FIG. 3 in accordance with some embodiments of the present disclosure. FIG. 5 is a cross-sectional diagram of the electronic device 1 corresponding to the section line X1-X1' in FIG. 3 after bonding with the electronic component 10T (or the electronic component 10T1) in accordance with some embodiments of the present disclosure. In accordance with some embodiments, additional features may be added to the electronic device 1 described below as needed.

The electronic device 1 may further include an insulating structure disposed on the substrate 102. For example, a first insulating layer 104 and/or a second insulating layer 106 may be disposed on the substrate 102, and the second insulating layer 106 may be disposed on the first insulating layer 104. In accordance with some embodiments, the first insulating layer 104 and/or the second insulating layer 106 may be disposed on the floating pad 202F, and the floating pad 202F may be disposed between the first insulating layer 104 (or the second insulating layer 106) and the substrate 102. In accordance with some embodiments, the first insulating layer 104 and the second insulating layer 106 may cover the metal frame FR and the observation region MR of the floating pad 202F.

In accordance with some embodiments, the first insulating layer 104 and/or the second insulating layer 106 may include a single-layer or multi-layer structure, and the materials of the multi-layer structure may be the same or different. In accordance with some embodiments, the material of the first insulating layer 104 and/or the second insulating layer 106 may include inorganic materials or organic materials, but it is not limited thereto. The inorganic material may include silicon nitride, silicon oxide, silicon oxynitride, another suitable material, or a combination thereof, but it is not limited thereto. The organic material may include polyethylene terephthalate (PET), polyethylene (PE), polyethersulfone (PES), polycarbonate (PC), polymethylmethacrylate (PMMA), polyimide (PI), another suitable material, or a combination thereof, but it is not limited thereto. In accordance with some embodiments, the first insulating layer 104 and the second insulating layer 106 are made of light-transmitting materials.

In accordance with some embodiments, the electronic device 1 may include a first transparent conductive pad 206-1 disposed on the substrate 102. The first transparent conductive pad 206-1 may be disposed on the floating pad 202F. The first transparent conductive pad 206-1 may include a first portion 206P1 located on the metal frame FR and a second portion 206P2 located on the observation region MR. In accordance with some embodiments, the first transparent conductive pad 206-1 may be disposed on the second insulating layer 106, and the first transparent conductive pad 206-1 may cover the metal frame FR and the observation region MR of the floating pad 202F. In the normal direction Z of the substrate 102, the first portion 206P1 of the first transparent conductive pad 206-1 may substantially overlap with the metal frame FR, and the second portion 206P2 of the first transparent conductive pad 206-1 may substantially overlap with the observation region MR.

In accordance with some embodiments, the first transparent conductive pad 206-1 may have a single-layer or multi-layer structure, and the materials of the multi-layer structure may be the same or different. In accordance with some embodiments, the material of the first transparent conductive pad 206-1 may include a transparent conductive material, for example, may include indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), another suitable transparent conductive material, or a combination thereof, but it is not limited thereto.

In accordance with some embodiments, the electronic component 10T (or the electronic component 10T1) may be disposed on the floating pad 202F and the conductive pad 202. As shown in FIG. 4 and FIG. 5, the conductive particles 300 may be disposed under the electronic component 10T (or the electronic component 10T1), and the conductive particles 300 may overlap with the observation region MR in the normal direction Z of the substrate 102. In accordance with some embodiments, the conductive particles 300 may be disposed between the second portion 206P2 of the first transparent conductive pad 206-1 and the electronic component 10T (or the electronic component 10T1). In accordance with some embodiments, the conductive particles 300 may be disposed under the electronic component 10T (or the electronic component 10T1) and overlap with the observation region MR.

In accordance with some embodiments, the electronic component 10T (or the electronic component 10T1) may have a bonding pad 11, and the bonding pad 11 may be electrically connected to the conductive pad 202 through the conductive particles 300. In accordance with some embodiments, the material of the bonding pad 11 may be the same as or different from that of the conductive pad 202, which will not be repeated here. The conductive particles 300 may be conductive particles in a conductive glue (not illustrated) used to bond the electronic component 10T (or the electronic component 10T1) on the substrate 102. In accordance with some embodiments, the conductive glue may include anisotropic conductive film (ACF), anisotropic conductive paste (ACP), another suitable conductive glue, or a combination thereof, but it is not limited thereto. In accordance with some embodiments, the material of the conductive particles 300 may include nickel (Ni), copper (Cu), aluminum (Al), molybdenum (Mo), indium (In), tin (Sn), gold (Au), zinc (Zn), silver (Ag), titanium (Ti), lead (Pb), another suitable conductive material or a combination thereof, but it is not limited thereto.

In accordance with some embodiments, in the bottom-view diagram of the electronic device 1, the area of the observation region MR is represented by area A1 (not labeled), the area of the conductive particle 300 is represented by A2 (not labeled), and the area A1 and the area A2 satisfy the following relationship: A1>A2. That is, the area of the observation region MR is larger than the area of the conductive particle 300. The area A1 refers to the projection area of the observation region MR on the substrate 102 in the bottom-view diagram of the electronic device 1. The area A2 refers to the projection area of a single conductive particle 300 on the substrate 102 after the bonding process in the bottom-view diagram of the electronic device 1.

In accordance with some embodiments, the area of the observation region MR is at least larger than the area of the single conductive particle 300, so that at least the pressed situation of the single conductive particle can be observed in the observation region MR. In accordance with some embodiments, the area A1 and the area A2 satisfy the following relationship: A1>2×A2. In accordance with some embodiments, the area A1 and the area A2 satisfy the following relationship: A1>4×A2. In accordance with some embodiments, the area A1 and the area A2 satisfy the following relationship: A1>5×A2.

As shown in FIG. 4 and FIG. 5, in accordance with some embodiments, in the normal direction Z of the substrate 102, the first transparent conductive pad 206-1 may be disposed on the floating pad 202F, and the first transparent conductive pad 206-1 may include a first portion 206P1 disposed on the metal frame FR and a second portion 206P2 disposed on the observation region MR. In accordance with some embodiments, in the normal direction Z of the substrate 102, the distance between an upper surface S1 of the first portion 206P1 and an upper surface S2 of the second portion 206P2 of the first transparent conductive pad 206-1 is represented by height H1, the height of the conductive particle 300 is represented by height H2, and the distance H1 and the height H2 satisfy the following relationship: H1<0.5×H2. In accordance with some embodiments, the distance H1 and the height H2 satisfy the following relationship: $0.01 \times H2 \le H1 < 0.5 \times H2$. In accordance with some embodiments, the distance H1 and the height H2 satisfy the following relationship: $0.01 \times H2 \le H1 < 0.4 \times H2$. In accordance with some embodiments, the distance H1 and the height H2 satisfy the following relationship: $0.01 \times H2 \le H1 < 0.35 \times H2$.

Since the upper surface S1 of the first portion 206P1 or the upper surface S2 of the second portion 206P2 may not be flat, for example, the positions of the measurement point Pa on the upper surface S1 of the first portion 206P1 and the measurement point Pb on the upper surface S2 of the second portion 206P2 may be taken in the following manner to obtain the distance H1. First, an extension line EL1 is obtained according to the inner edge 202i of the metal frame FR, and the extension line EL1 extends along the normal direction Z of the substrate 102. Next, in a direction perpendicular to the normal direction Z of the substrate 102 (for example, the first direction X), the measurement point Pa can be obtained on the upper surface S1 of the first portion 206P1 at a distance of about 2 μm from the extension line EL1 in the direction away from the observation region MR. In addition, the measurement point Pb can be obtained on the upper surface S2 of the second portion 206P2 at a distance of about 2 μm from the extension line EL1 in the direction away from the metal frame FR. The distance H1 refers to the distance between the measurement point Pa and the measurement point Pb measured in the normal direction Z of the substrate 102. The aforementioned height H2 refers to the maximum height of the conductive particle 300 after the bonding process (i.e. pressing) in the normal direction Z of the substrate 102.

In accordance with some embodiments, the distance H1 is, for example, smaller than the height H2, and the distance H1 and the height H2 satisfy the following relationship: H1<0.5×H2), so that the conductive particle 300 can be reliably pressed during the bonding process.

Figure 6:
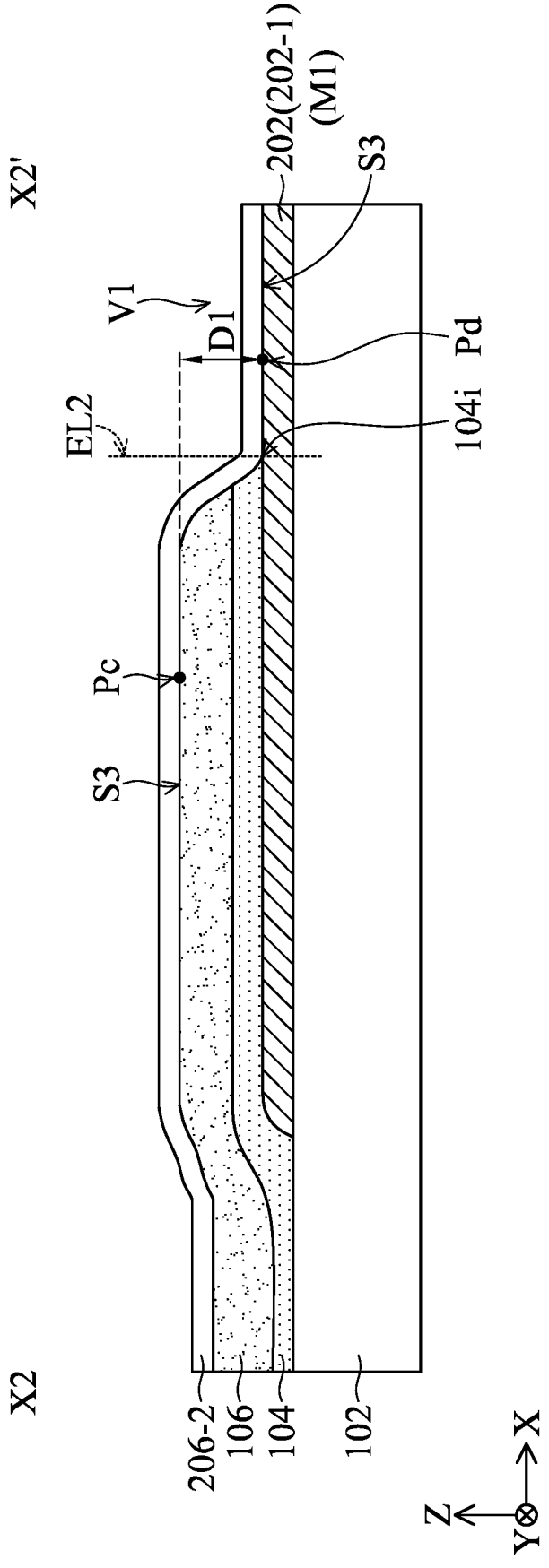
FIG. 6 is a cross-sectional diagram of an electronic device corresponding to the section line X2-X2' in FIG. 3 in accordance with some embodiments of the present disclosure.
Figure 7:
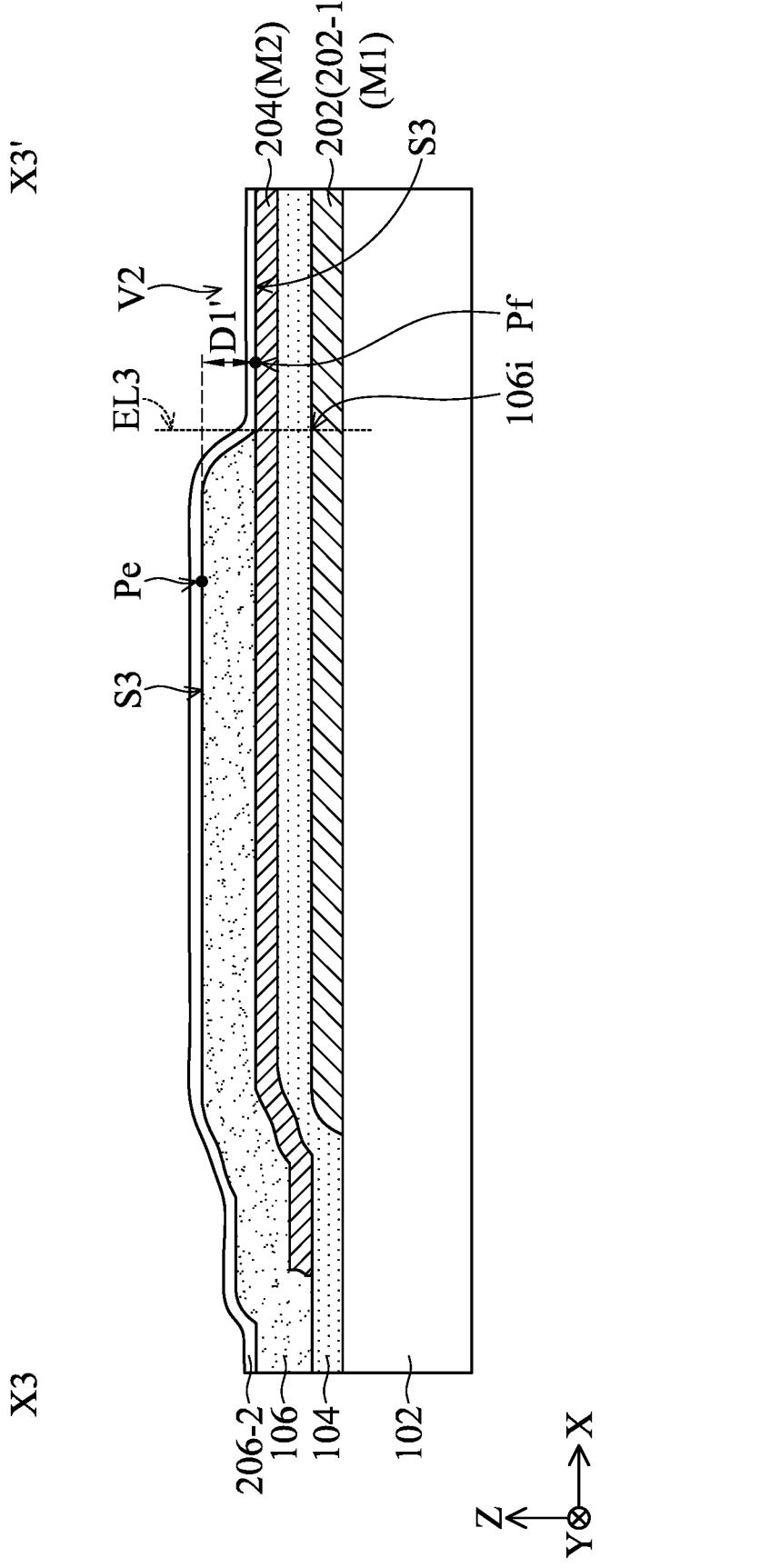
FIG. 7 is a cross-sectional diagram of an electronic device corresponding to the section line X3-X3' in FIG. 3 in accordance with some embodiments of the present disclosure.

Please refer to FIG. 3, FIG. 6 and FIG. 7. FIG. 6 is a cross-sectional diagram of the electronic device 1 corresponding to the section line X2-X2' in FIG. 3 in accordance with some embodiments of the present disclosure. FIG. 7 is a cross-sectional diagram of the electronic device 1 corresponding to the section line X3-X3' in FIG. 3 in accordance with some embodiments of the present disclosure. In accordance with some embodiments, additional features may be added to the electronic device 1 described below.

In accordance with some embodiments, the first insulating layer 104 and the second insulating layer 106 may be disposed on the conductive pad 202, and the conductive pad 202 may be disposed between the first insulating layer 104 and the substrate 102. The electronic device 1 may include a second transparent conductive pad 206-2 and a third conductive pad 204 disposed on the substrate 102. The third conductive pad 204 may be disposed on the first conductive pad 202-1, and the second transparent conductive pad 206-2 may be disposed on the first conductive pad 202-1 and the third conductive pad 204. In accordance with some embodiments, the first conductive pad 202-1 and the third conductive pad 204 may be electrically connected to each other and may transmit the same signal (such as scan signals or data signals), but it is not limited thereto.

In accordance with some embodiments, the second transparent conductive pad 206-2 and the first transparent conductive pad 206-1 may belong to the same conductive layer in the electronic device 1, but it is not limited thereto. The first conductive pad 202-1 and the metal frame FR of the floating pad 202F may belong to the same conductive layer in the electronic device 1, but it is not limited thereto.

In accordance with some embodiments, the second transparent conductive pad 206-2 may have a single-layer or multi-layer structure, and the materials of the multi-layer structure may be the same or different. In accordance with some embodiments, the material of the second transparent conductive pad 206-2 may include a transparent conductive material, for example, may include indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), another suitable transparent conductive material, or a combination thereof, but it is not limited thereto. The material of the first transparent conductive pad 206-1 may be the same as or different from that of the second transparent conductive pad 206-2.

In accordance with some embodiments, in the normal direction of the substrate 102, the third conductive pad 204 may partially overlap with the first conductive pad 202-1. The third conductive pad 204 and the first conductive pad 202-1 belong to different conductive layers in the electronic device 1. In accordance with some embodiments, in the top-view diagram of the electronic device 1 (for example, the X-Y plane shown in FIG. 3), the area of the third conductive pad 204 may be different from the area of the first conductive pad 202-1. For example, in the top-view diagram of the electronic device 1 (for example, the X-Y plane shown in FIG. 3), the area of the third conductive pad 204 may be smaller than the area of the first conductive pad 202-1.

In accordance with some embodiments, the third conductive pad 204 may have a single-layer or multi-layer structure, and the materials of the multi-layer structure may be the same or different. In accordance with some embodiments, the material of the third conductive pad 204 may be the same as or different from that of the first conductive pad 202-1, which will not be repeated here.

In accordance with some embodiments, the first insulating layer 104 and/or the second insulating layer 106 may be disposed between the first conductive pad 202-1 and the second transparent conductive pad 206-2. In accordance with some embodiments, the second transparent conductive pad 206-2 may be electrically connected to the first conductive pad 202-1 through a via hole V1 of the first insulating layer 104. In accordance with some embodiments, the second transparent conductive pad 206-2 may be electrically connected to the third conductive pad 204 through a via hole V2 of the second insulating layer 106, but it is not limited thereto. As shown in FIG. 6, in accordance with some embodiments, in the via hole V1, the second transparent conductive pad 206-2 may be in contact with the first conductive pad 202-1 to be electrically connected. In accordance with some embodiments, in the normal direction Z of the substrate 102, the depth of the via hole V1 of the first insulating layer 104 is represented by depth D1, and the depth D1 of the via hole V1 of the first insulating layer 104 and the aforementioned distance H1 (as shown in FIG. 4) satisfy the following relationship: $0.3 \leq H1/D1 \leq 1.5$, but it is not limited thereto. In accordance with some embodiments, the depth D1 and the distance H1 satisfy the following relationship: $0.3 \leq H1/D1 \leq 1.2$, or $0.3 \leq H1/D1 \leq 1$, or $0.3 \leq H1/D1 \leq 0.8$, for example, H1/D1 is equal to 0.4, 0.5, 0.6 or 0.7. In accordance with some embodiments, the depth D1 and the distance H1 satisfy the following relationship: $0 \leq |H1-D1| \leq 2$ μm, or $0 \leq |H1-D1| \leq 1.6$ μm, for example, |H1−D1| is equal to 0.05 μm, 0.1 μm, 0.15 μm or 0.8 μm. In accordance with some embodiments, the depth D1 and the aforementioned distance H1 and height H2 (as shown in FIG. 4 and FIG. 5) satisfy the following relationship: $0 \leq |H1-D1|/H2 \leq 0.25$. In accordance with some embodiments, the depth D1 and the aforementioned distance H1 and height H2 satisfy the following relationship: $0 \leq |H1-D1|/H2 \leq 0.23$. In accordance with some embodiments, the depth D1 and the aforementioned distance H1 and height H2 satisfy the following relationship: $0 \leq |H1-D1|/H2 \leq 0.2$.

The depth D1 refers to the depth of the via hole V1 in the normal direction of the substrate 102. The depth D1 is obtained, for example, in the following manner: First, an extension line EL2 is obtained according to an inner edge 104i of the via hole V1, and the extension line EL2 extends along the normal direction Z of the substrate 102. The measurement point Pc can be obtained on the bottom surface S3 of the second transparent conductive pad 206-2 at a distance of about 2 μm from the extension line EL2 in the direction away from the via hole V1. In addition, the measurement point Pd can be obtained on bottom surface S3 of the second transparent conductive pad 206-2 at a distance of about 2 μm from the extension line EL2 in the direction adjacent to the via hole V1. The aforementioned depth D1 refers to the distance between the measurement point Pc and the measurement point Pd measured in the normal direction Z of the substrate 102. In addition, the definitions of the distance H1 and the height H2 are the same as those described in the above-mentioned FIG. 4 and FIG. 5, and thus will not be repeated here.

It should be noted that when the depth D1 and the distance H1 satisfy the following relationship: $0.3 \leq H1/D1 \leq 1.5$, or $0 \leq |H1-D1| \leq 2$ μm, or when the distance H1 and the height H2 satisfy the following relationship: $0 \leq |H1-D1|/H2 \leq 0.25$, the floating pad 202F can further reflect the possible bonding process conditions at the position of conductive pad 202, thereby improving the yield of the bonding process.

As shown in FIG. 7, in accordance with some embodiments, the first insulating layer 104 may be disposed between the first conductive pad 202-1 and the third conductive pad 204, and the second transparent conductive pad 206-2 may be electrically connected to the third conductive pad 204 through the via hole V2 of the second insulating layer 106. In accordance with some embodiments, in the via hole V2, the second transparent conductive pad 206-2 and the third conductive pad 204 may be in contact to be electrically connected. In accordance with some embodiments, the third conductive pad 204 may be not in contact with the first conductive pad 202-1, but the first conductive pad 202-1 and the third conductive pad 204 may be electrically connected through the second transparent conductive pad 206-2. In accordance with some embodiments, in the normal direction Z of the substrate 102, the depth of the via hole V2 of the second insulating layer 106 is represented by D1', and the depth D1' of the via hole V2 of the second insulating layer 106 and the distance H1 (e.g. as shown in FIG. 4) satisfy the following relationship: $0.3 \leq H1/D1' \leq 1.5$. In accordance with some embodiments, the depth D1' and the distance H1 satisfy the following relationship: $0.3 \leq H1/D1' \leq 1$, or $0.3 \leq H1/D1' \leq 0.8$, for example, $H1/D1'$ is equal to 0.4, 0.5, 0.6 or 0.7. In accordance with some embodiments, the depth D1' and the distance H1 satisfy the following relationship: $0 \leq |H1-D1'| \leq 2$ μm, for example, $|H1-D1'|$ is equal to 0.05, 0.1 or 0.15. In accordance with some embodiments, the depth D1' of the via hole V2 and the aforementioned distance H1 and height H2 (as shown in FIG. 4 and FIG. 5) satisfy the following relationship: $0 \leq |H1-D1|/H2 \leq 0.25$.

The aforementioned depth D1' refers to the depth of the via hole V2 in the normal direction Z of the substrate 102, and the depth D1' is obtained, for example, in the following manner: First, an extension line EL3 is obtained according to an inner edge 106i of the via hole V2, and the extension line EL3 extends along the normal direction Z of the substrate 102. The measurement point Pe can be obtained on the bottom surface S3 of the second transparent conductive pad 206-2 at a distance of about 2 μm from the extension line EL3 in the direction away from the via hole V2. In addition, the measurement point Pf can be obtained on bottom surface S3 of the second transparent conductive pad 206-2 at a distance of about 2 μm from the extension line EL3 in the direction adjacent to the via hole V2. The aforementioned depth D1' refers to the distance between the measurement point Pe and the measurement point Pf measured in the normal direction Z of the substrate 102.

It should be noted that when the depth D1' and the distance H1 satisfy the following relationship: $0.3 \leq H1/D1' \leq 1.5$, or $0 \leq |H1-D1'| \leq 2$ μm, or when the depth D1', the distance H1 and the height H2 satisfy the following relationship: $0 \leq H1-D1'/H2 \leq 0.25$, or $0 \leq H1-D1' \leq 2$ μm, the floating pad 202F can further reflect the possible bonding process conditions at the position of conductive pad 202, thereby improving the yield of the bonding process.

Figure 8:
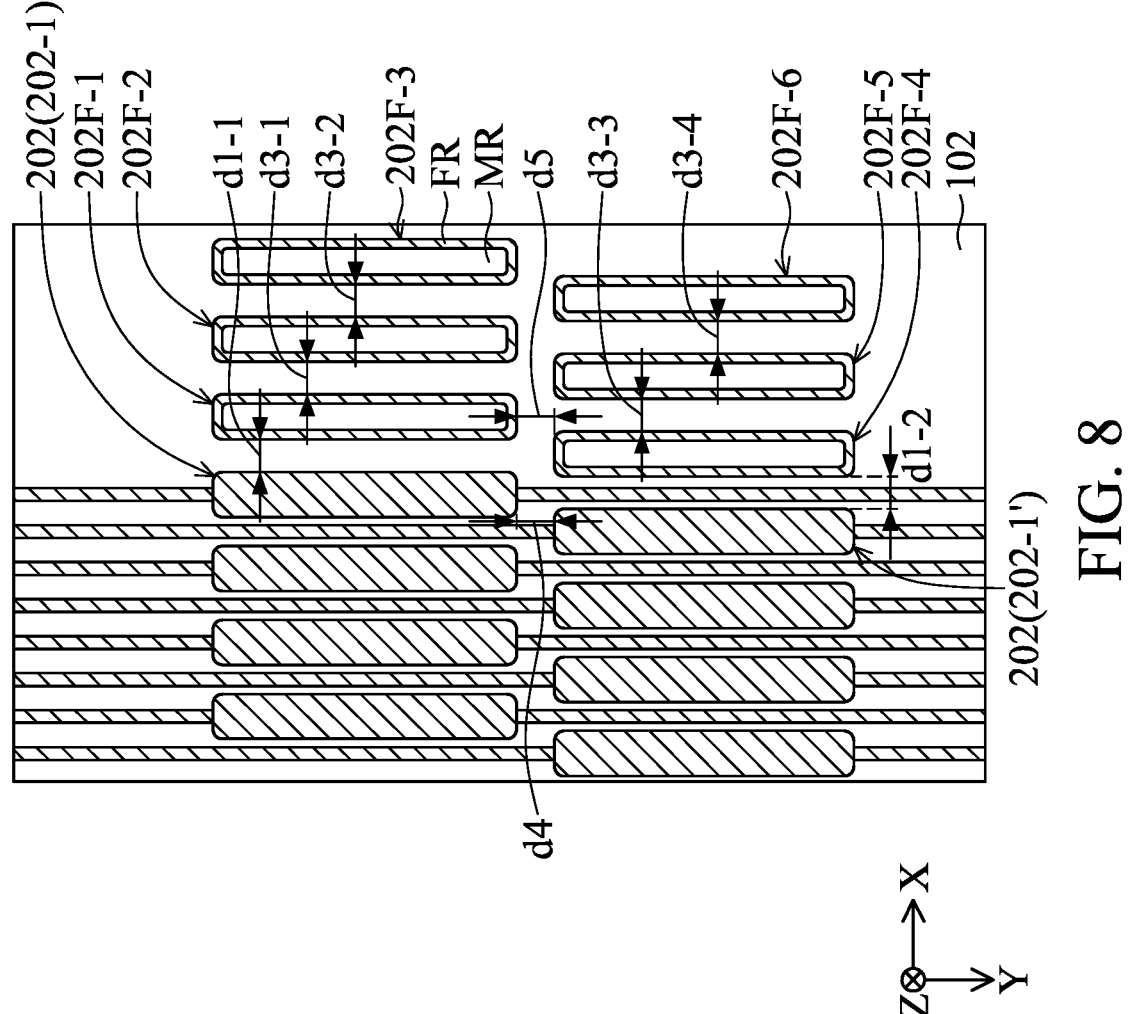
FIG. 8 is a bottom-view diagram of some components of an electronic device in accordance with some embodiments of the present disclosure.

Next, please refer to FIG. 8, which is a bottom-view diagram of some components of the electronic device 1 in accordance with some other embodiments of the present disclosure. Specifically, FIG. 8 shows a schematic structural diagram of the conductive pads 202 and the floating pads 202F in a partial area of the electronic device 1 viewed from the backside of the substrate 102. It should be understood that the components or components that the same or similar components or elements in above and below contexts are represented by the same or similar reference numerals. The materials and functions of these components or elements are the same or similar to those described above, and thus will not be repeated herein.

In accordance with some embodiments, the electronic device 1 may include a plurality of rows of conductive pads 202 and floating pads 202F. For example, the plurality of conductive pads 202 and the plurality of floating pads 202F may be arranged along the first direction X to form a row. That is, there may be a plurality of floating pads 202F in the same row, and the plurality of rows may be arranged along the second direction Y. In accordance with some embodiments, the conductive pads 202 located in different rows may be misaligned with each other, and the floating pads 202F in different rows may be misaligned with each other, but they are not limited thereto.

In accordance with some embodiments, the distance between the first conductive pad 202-1 of the conductive pads 202 and the adjacent floating pad 202F may be substantially similar to the distance between the plurality of floating pads 202F. As shown in FIG. 8, different floating pads 202F are labeled as 202F-1, 202F-2, 202F-3, 202F-4, 202F-5, and 202F-6 for clarity. In accordance with some embodiments, the floating pad 202F-1 may be adjacent to the first conductive pad 202-1, the floating pad 202F-2 may be adjacent to the floating pad 202F-1, the floating pad 202F-3 may be adjacent to the floating pad 202F-2, and so on. In other words, the first conductive pad 202-1, the floating pad 202F-1, the floating pad 202F-2 and the floating pad 202F-3 may be located in the same row and arranged along the first direction X.

In accordance with some embodiments, in the first direction X, the distance between the first conductive pad 202-1 and the floating pad 202F-1 is represented by distance d1-1, the distance between the floating pad 202F-1 and the floating pad 202F-2 is represented by distance d3-1, and the distance between the floating pad 202F-2 and the floating pad 202F-3 is represented by distance d3-2. In accordance with some embodiments, the distance d1-1 and the distance d3-1 satisfy the following relationship: $0.5 \leq d1-1/d3-1 \leq 1.5$. In accordance with some embodiments, the distance d1-1 and the distance d3-1 satisfy the following relationship: $0.8 \leq d1-1/d3-1 \leq 1.3$. In accordance with some embodiments, the distance d1-1 and the distance d3-1 satisfy the following relationship: $0.6 \leq d1-1/d3-1 \leq 1.1$. In accordance with some embodiments, the distance d3-1 and the distance d3-2 satisfy the following relationship: $0.5 \leq d3-1/d3-2 \leq 1.5$. In accordance with some embodiments, the distance d3-1 and the distance d3-2 satisfy the following relationship: $0.8 \leq d3-1/d3-2 \leq 1.3$. In accordance with some embodiments, the distance d3-1 and the distance d3-2 satisfy the following relationship: $0.6 \leq d3-1/d3-2 \leq 1.1$. The definition of the distance d1-1 is similar to the definition of the aforementioned distance d1, and thus will not be repeated here. Moreover, the distance d3-1 refers to the minimum distance between the floating pad 202F-1 and the floating pad 202F-2 in the direction in which the floating pad 202F-1 and the floating pad 202F-2 are arranged (for example, the first direction X). Similarly, the distance d3-2 refers to the minimum distance between the floating pad 202F-2 and the floating pad 202F-3 in the direction in which the floating pad 202F-1 and the floating pad 202F-2 are arranged (for example, the first direction X).

Similarly, in accordance with some embodiments, the floating pad 202F-4 may be adjacent to the first conductive pad 202-1', the floating pad 202F-5 may be adjacent to the floating pad 202F-4, and the floating pad 202F-6 may be adjacent to the floating pad 202F-5. In other words, the first conductive pad 202-1', the floating pad 202F-4, the floating pad 202F-5, and the floating pad 202F-6 may be located in another row and arranged along the first direction X.

In accordance with some embodiments, in the first direction X, the distance between the first conductive pad 202-1' and the floating pad 202F-4 is represented by distance d1-2, the distance between the floating pad 202F-4 and the floating pad 202F-5 is represented by distance d3-3, and the distance between the floating pad 202F-5 and the floating pad 202F-6 is represented by distance d3-4. In accordance with some embodiments, the distance d1-2 and the distance d3-3 satisfy the following relationship: $0.5 \leq d1-2/d3-3 \leq 1.5$, but it is not limited thereto. In accordance with some embodiments, the distance d3-3 and the distance d3-4 satisfy the following relationship: $0.5 \leq d3-3/d3-4 \leq 1.5$, but it is not limited thereto. The definition of the distance d1-2 is similar to the definition of the aforementioned distance d1-1, the definition of the distance d3-3 is similar to the definition of the aforementioned distance d3-1, the definition of the distance d3-4 is similar to the definition of the aforementioned distance d3-2, and thus will not be repeated here.

In accordance with some embodiments, the pitch (not labeled) between the conductive pad 202 (e.g., the first conductive pad 202-1) and the adjacent floating pad 202F (e.g., the floating pad 202F-1) may be substantially similar to the pitch (not labeled) between two adjacent floating pads 202F-2 (e.g., two adjacent ones of the floating pad 202F-1, the floating pad 202F-2 and the floating pad 202F-3). For the definition of these pitches, please refer to the content described in FIG. 2 above. In accordance with some embodiments, the distance between the conductive pads 202 located in adjacent rows and the distance between the floating pads 202F located in adjacent rows may be substantially similar. For example, in accordance with some embodiments, in the second direction Y, the minimum distance d4 between adjacent conductive pads 202 F may be substantially similar to the minimum distance d5 between adjacent floating pads 202. In accordance with some embodiments, the distance d4 and the distance d5 satisfy the following relationship: $0.5 \leq d4/d5 \leq 1.5$, but it is not limited thereto. In accordance with some embodiments, the distance d4 and the distance d5 satisfy the following relationship: $0.7 \leq d4/d5 \leq 1.3$, but it is not limited thereto. In accordance with some embodiments, the distance d4 and the distance d5 satisfy the following relationship: $0.8 \leq d4/d5 \leq 1.2$, but it is not limited thereto.

Figure 9:
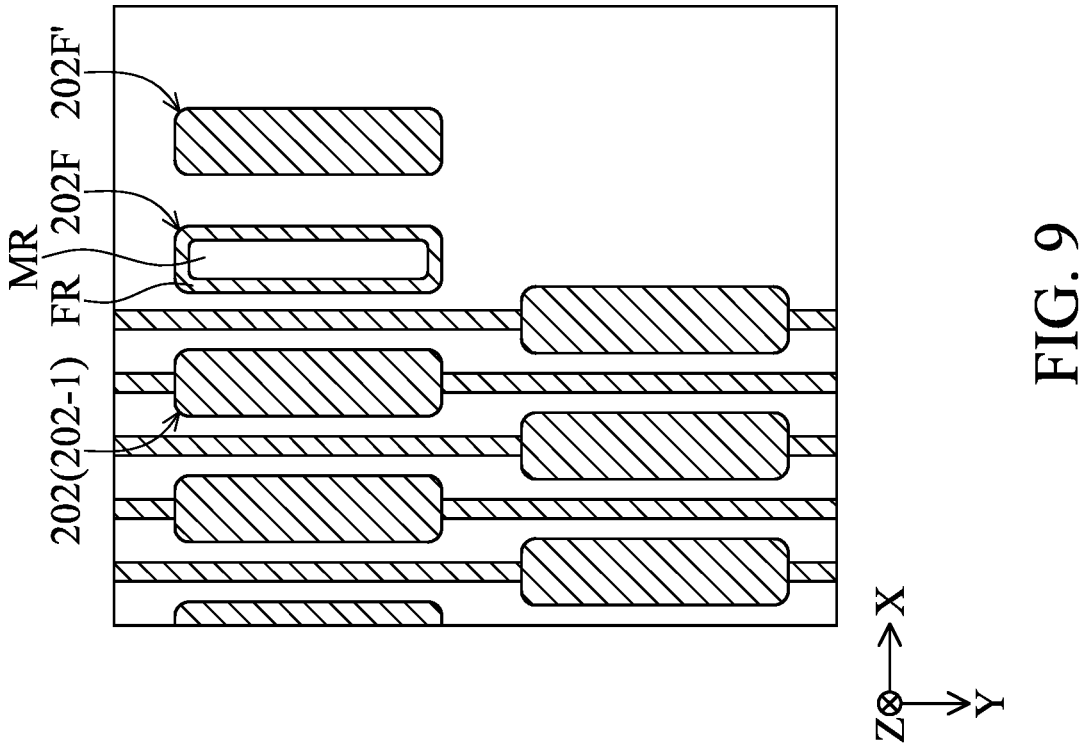
FIG. 9 is a bottom-view diagram of some components of an electronic device in accordance with some embodiments of the present disclosure.

Please refer to FIG. 9, which is a bottom-view diagram of some components of the electronic device 1 in accordance with some other embodiments of the present disclosure. Specifically, FIG. 9 shows a schematic structural diagram of the conductive pads 202 and the floating pads 202F in a partial area of the electronic device 1 viewed from the backside of the substrate 102.

In accordance with some embodiments, the electronic device 1 may include a dummy conductive pad 202F'. The dummy conductive pad 202F' may be disposed adjacent to the floating pad 202F, and the dummy conductive pad 202F' is not electrically connected to any wire (e.g., the wire W1 or the wire W1-1 shown in FIG. 1). In accordance with some embodiments, the floating pad 202F may be located between the dummy conductive pad 202F' and the conductive pad 202, and the dummy conductive pad 202F' does not have the observation region MR. In accordance with some embodiments, the conductive pad 202, the floating pad 202F and the dummy conductive pads 202F' may be arranged along the first direction X. In accordance with some embodiments (not illustrated), the size of the outline of the dummy conductive pad 202F' may be the same as or different from the size of the outline of the floating pad 202F. For example, the size of the outline of the dummy conductive pad 202F' may be larger or smaller than the size of the outline of the floating pad 202F.

Figure 10:
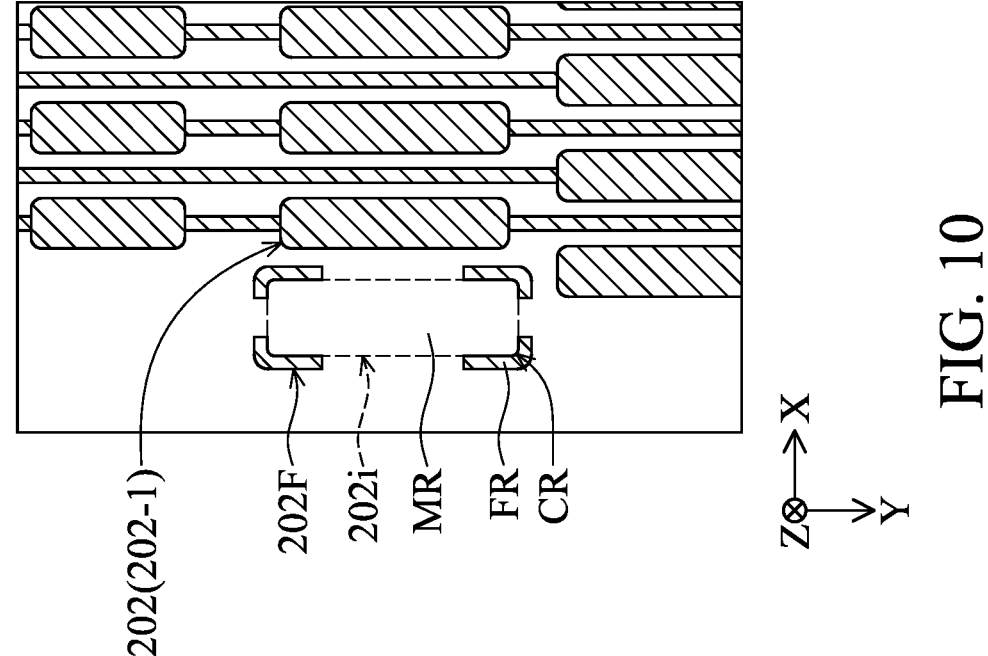
FIG. 10 is a bottom-view diagram of some components of an electronic device in accordance with some embodiments of the present disclosure.

Next, please refer to FIG. 10, which is a bottom-view diagram of some components of the electronic device 1 in accordance with some other embodiments of the present disclosure. Specifically, FIG. 10 shows a schematic structural diagram of the conductive pads 202 and the floating pads 202F in a partial area of the electronic device 1 viewed from the backside of the substrate 102.

In accordance with some embodiments, the metal frame FR of the floating pad 202F may be a discontinuous structure, the metal frame FR may include a plurality of segments, and the plurality of segments may not be connected to each other. For example, the metal frame FR may include several (for example, four) segments located at different corners, and the shapes of these segments may be, for example, L-shaped or other suitable shapes, but they are not limited thereto. In accordance with some other embodiments (not illustrated), the metal frame FR may include more segments or less segments. In this embodiment, the plurality of segments of the metal frame FR may substantially frame the inner edge 202i, and the inner edge 202i may define the observation region MR, and the outline of the observation region MR may also have an arc-shaped edge CR.

Figure 11:
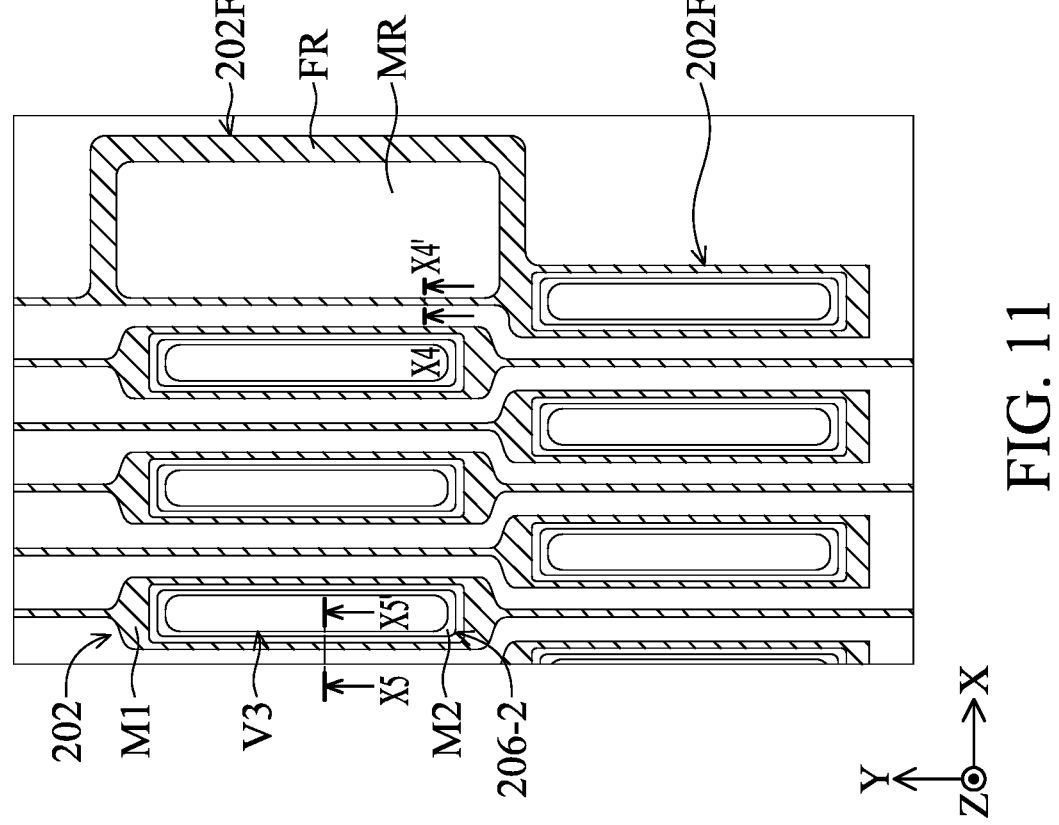
FIG. 11 is a top-view diagram of some components of an electronic device in accordance with some embodiments of the present disclosure.
Figure 12:
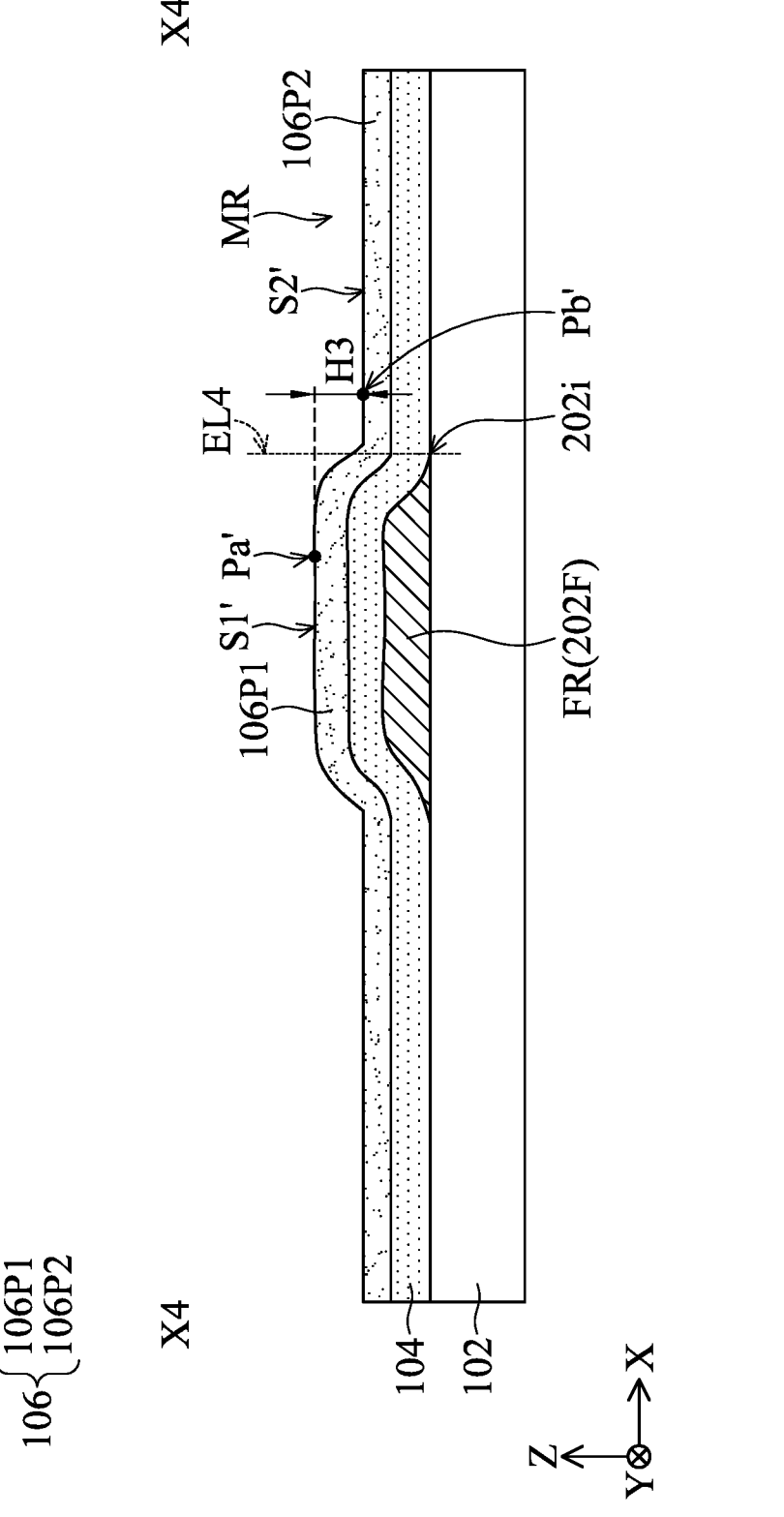
FIG. 12 is a cross-sectional diagram of an electronic device corresponding to the section line X4-X4' in FIG. 11 in accordance with some embodiments of the present disclosure.
Figure 13:
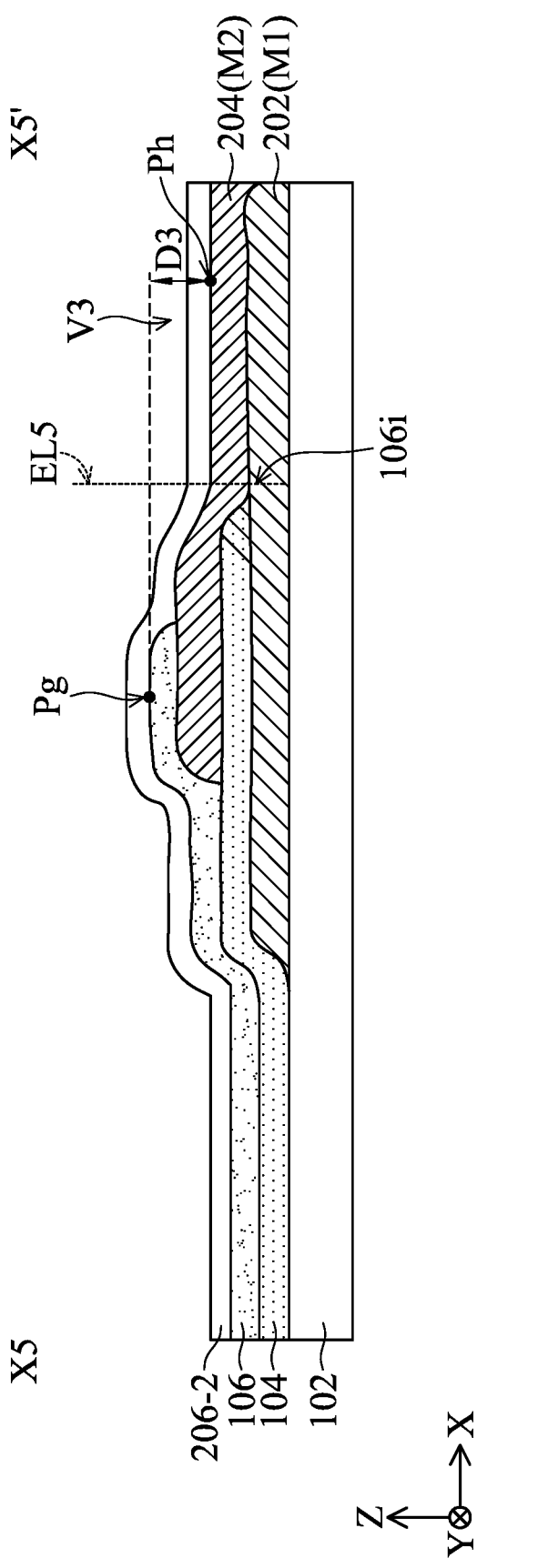
FIG. 13 is a cross-sectional diagram of an electronic device corresponding to the section line X5-X5' in FIG. 11 in accordance with some embodiments of the present disclosure.

Please refer to FIG. 11 to FIG. 13. FIG. 11 is a top-view diagram of some components of an electronic device in accordance with some other embodiments of the present disclosure. FIG. 12 is a cross-sectional diagram of the electronic device corresponding to the section line X4-X4' in FIG. 11 in accordance with some embodiments of the present disclosure. FIG. 13 is a cross-sectional diagram of the electronic device corresponding to the section line X5-X5' in FIG. 11 in accordance with some embodiments of the present disclosure. In accordance with some embodiments, additional features may be added to the electronic device described below.

In this embodiment, the first transparent conductive pad 206-1 may not be disposed on the floating pad 202F. Specifically, in this embodiment, the first transparent conductive pad 206-1 may not be disposed on the floating pad 202F, but the second transparent conductive pad 206-2 may still be disposed on the conductive pad 202. In this embodiment, the floating pads 202F in different rows may be connected to each other, and the floating pads 202F in different rows may have different structures and/or sizes, but they are not limited thereto. For example, the floating pads 202F in one row may have the metal frame FR and the observation region MR, while the floating pads 202F in the other row may have a structure similar to that of the conductive pads 202 (that is, without the observation region MR) but are not electrically connected to the signal lines, but it is not limited thereto.

As shown in FIG. 12, in accordance with some embodiments, the second insulating layer 106 may be disposed on the first insulating layer 104, the first insulating layer 104 may be disposed on the floating pad 202F, and the floating pad 202F may be disposed between the first insulating layer 104 and the substrate 102. Specifically, the first insulating layer 104 and/or the second insulating layer 106 may cover the metal frame FR and the observation region MR of the floating pad 202F. In accordance with some embodiments, the second insulating layer 106 may include a first portion 106P1 disposed on the metal frame FR and a second portion 106P2 disposed on the observation region MR. Moreover, the electronic component 10T (not illustrated, referring to FIG. 5) may be disposed on the floating pad 202F, and the conductive particles 300 (not illustrated, referring to FIG. 5) may be disposed under the electronic device 10T and overlap with the observation region MR in the normal direction Z of the substrate 102. The conductive particles 300 may be disposed between the second portion 106P2 of the second insulating layer 106 and the electronic component 10T.

In this embodiment, in the normal direction of the substrate 102, the distance between an upper surface S1' of the first portion 106P1 of the second insulating layer 106 and an upper surface S2' of the second portion 106P2 is represented by distance H3, the height of the conductive particle 300 is represented by height H2 (as shown in FIG. 5), and the distance H3 and the height H2 satisfy the following relationship: H3<0.5×H2. In accordance with some embodiments, the distance H3 and the height H2 satisfy the following relationship: 0.01×H2≤H3<0.5×H2. In accordance with some embodiments, the distance H3 and the height H2 satisfy the following relationship: 0.02×H2≤H3<0.4×H2.

For example, the positions of the measurement point Pa' on the upper surface S1' of the first portion 106P1 and the measurement point Pb' on the upper surface S2' of the second portion 106P2 may be taken in the following manner to obtain the distance H3. First, an extension line EL4 is obtained according to the inner edge 202*i* of the metal frame FR, and the extension line EL4 extends along the normal direction Z of the substrate 102. Next, in a direction perpendicular to the normal direction Z of the substrate 102 (for example, the first direction X), the measurement point Pa' can be obtained on the upper surface S1' of the first portion 106P1 at a distance of about 2 μm from the extension line EL4 in the direction away from the observation region MR. In addition, the measurement point Pb' can be obtained on the upper surface S2' of the second portion 106P2 at a distance of about 2 μm from the extension line EL4 in the direction away from the metal frame FR. The aforementioned distance H3 refers to the distance between the measurement point Pa' and the measurement point Pb' measured in the normal direction Z of the substrate 102.

In this embodiment, the distance H3 may be less than the height H2 of the conductive particle 300. For example, the distance H3 and the height H2 satisfy the following relationship: H3<0.5×H2, so that the conductive particle 300 can be reliably pressed during the bonding process.

As shown in FIG. 13, in this embodiment, the second transparent conductive pad 206-2 may be disposed on the conductive pad 202 and/or the third conductive pad 204. In the normal direction Z of the substrate 102, the third conductive pad 204 may partially overlap with the conductive pad 202, and the third conductive pad 204 and the conductive pad 202 may belong to different conductive layers. In this embodiment, the first insulating layer 104 may be disposed between the conductive pad 202 and the third conductive pad 204, and the second transparent conductive pad 206-2 may be electrically connected to the third conductive pad 204 through the via hole V3 of the second insulating layer 106. In accordance with some embodiments, the second transparent conductive pad 206-2 may be in contact with the third conductive pad 204 through the via hole V3 to be electrically connected. In some embodiments, the third conductive pad 204 may not be in contact with the conductive pad 202, but the conductive pad 202 and the third conductive pad 204 may be electrically connected to each other through the second transparent conductive pad 206-2, but it is not limited thereto.

In this embodiment, in the normal direction Z of the substrate 102, the depth of the via hole V3 of the second insulating layer 106 is represented by D3, and the depth D3 of the via hole V3 of the second insulating layer 106 and the aforementioned distance H3 (as shown in FIG. 12) satisfy the following relationship: 0.5≤H3/D3≤1.5. In accordance with some embodiments, the depth D3 and the distance H3 satisfy the following relationship: 0.8≤H3/D3≤1.3. In accordance with some embodiments, the depth D3 and the distance H3 satisfy the following relationship: 0.7≤H3/D3≤1.2. In accordance with some embodiments, the depth D3 and the distance H3 satisfy the following relationship: 0≤|H3−

D3|≤2 In accordance with some embodiments, the depth D3 and the distance H3 satisfy the following relationship: 0≤|H3−D3|≤1.5 In accordance with some embodiments, the depth D3 and the distance H3 satisfy the following relationship: 0≤|H3−D3|≤1.2 In accordance with some embodiments, the depth D3 of the via hole V3 and the aforementioned distance H3 and height H2 (as shown in FIG. 5) satisfy the following relationship with: 0≤|H3−D3|/H2≤0.25. In accordance with some embodiments, the depth D3 of the via hole V3 and the aforementioned distance H3 and height H2 satisfy the following relationship: 0≤|H3−D3|/H2≤0.2. In accordance with some embodiments, the depth D3 of the via hole V3 and the aforementioned distance H3 and height H2 satisfy the following relationship: 0≤|H3−D3|/H2≤0.15.

The aforementioned depth D3 is obtained, for example, in the following manner. First, an extension line EL5 is obtained according to the inner edge 106*i* of the via hole V3, and the extension line EL5 extends along the normal direction Z of the substrate 102. Next, in the direction perpendicular to the normal direction Z of the substrate 102 (for example, the first direction X), the measurement point Pg can be obtained on the bottom surface S3 of the second transparent conductive pad 206-2 at a distance of about 2 μm from the extension line EL5 in the direction away from the via hole V3. In addition, the measurement point Ph can be obtained on bottom surface S3 of the second transparent conductive pad 206-2 at a distance of about 2 μm from the extension line EL5 in the direction adjacent to the via hole V3. The aforementioned depth D3 refers to the distance between the measurement point Pg and the measurement point Ph measured in the normal direction Z of the substrate 102.

To summarize the above, in accordance with the embodiments of the present disclosure, an electronic device is provided, including a floating pad disposed adjacent to a conductive pad. The floating pad has an observation region. By observing the observation region of the floating pad, the bonding process status of the adjacent conductive pad and the electronic component can be known. In this way, the yield of the bonding process can be effectively improved.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Thus, the appended claims are intended to include within their scope such processes, machines, manufacture, compositions of matter, means, methods or steps. Moreover, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:

a substrate;

a first conductive pad disposed on the substrate; and a floating pad disposed on the substrate and adjacent to the first conductive pad, wherein the floating pad comprises a metal frame, wherein an inner edge of the metal frame defines an outline of an observation region;

a first transparent conductive pad disposed on the floating pad, and the first transparent conductive pad comprises a first portion disposed on the metal frame and a second portion disposed on the observation region;

an electronic component disposed on the floating pad; and a conductive particle disposed between the second portion of the first transparent conductive pad and the electronic component, wherein in a bottom-view diagram of the electronic device, the outline of the observation region has at least one arc-shaped edge, wherein in a normal direction of the substrate, a distance between a surface of the first portion and a surface of the second portion is represented by H1, a height of the conductive particle is represented by H2, and H1 and H2 satisfy the following relationship:

$$H1 < 0.5 \times H2.$$

2. The electronic device as claimed in claim 1, wherein the conductive particle is disposed under the electronic component and overlapping with the observation region, wherein in the bottom-view diagram of the electronic device, an area of the observation region is represented by A1, an area of the conductive particle is represented by A2, and A1 and A2 satisfy the following relationship:

$$A1 > A2.$$

3. The electronic device as claimed in claim 2, wherein A1 and A2 satisfy the following relationship:

$$A1 > 2 \times A2.$$

4. The electronic device as claimed in claim 1, wherein H1 and H2 satisfy the following relationship:

$$0.01 \times H2 \leq H1 < 0.5 \times H2.$$

5. The electronic device as claimed in claim 1, further comprising:

a second transparent conductive pad disposed on the first conductive pad; and an insulating layer disposed between the first conductive pad and the second transparent conductive pad, wherein the second transparent conductive pad is electrically connected to the first conductive pad through a via hole of the insulating layer, wherein in the normal direction of the substrate, a depth of the via hole of the insulating layer is represented by D1, and D1, H1, and H2 satisfy the following relationship:

$$0 \leq |H1 - D1|/H2 \leq 0.25.$$

6. The electronic device as claimed in claim 1, further comprising:

an insulating layer disposed on the floating pad, wherein the insulating layer comprises a first portion disposed on the metal frame and a second portion disposed on the observation region, wherein the conductive particle is disposed between the second portion of the insulating layer and the electronic component, wherein in the normal direction of the substrate, a distance between a surface of the first portion and a surface of the second portion of the insulating layer is represented by H3, a height of the conductive particle is represented by H2, and H2 and H3 satisfy the following relationship:

$$H3 < 0.5 \times H2.$$

7. The electronic device as claimed in claim 1, further comprising:

a second transparent conductive pad disposed on the first conductive pad; and an insulating layer disposed between the first conductive pad and the second transparent conductive pad, wherein the second transparent conductive pad is electrically connected to the first conductive pad through a via hole of the insulating layer, wherein in the normal direction of the substrate, a depth of the via hole of the insulating layer is represented by D1, and D1 and H1 satisfy the following relationship:

$$0.3 \leq H1/D1 \leq 1.5.$$

8. The electronic device as claimed in claim 1, further comprising:

a second transparent conductive pad disposed on the first conductive pad; and an insulating layer disposed between the first conductive pad and the second transparent conductive pad, wherein the second transparent conductive pad is electrically connected to the first conductive pad through a via hole of the insulating layer, wherein in the normal direction of the substrate, a depth of the via hole of the insulating layer is represented by D1, and D1 and H1 satisfy the following relationship:

$$0 \leq |H1 - D1| \leq 2 \text{ micrometers.}$$

9. The electronic device as claimed in claim 1, further comprising:

a second conductive pad adjacent to the first conductive pad, wherein the first conductive pad and the second conductive pad are arranged along a first direction, and in the first direction, a distance between the floating pad and the first conductive pad is represented by d1, a distance between the first conductive pad and the second conductive pad is represented by d2, and d1 and d2 satisfy the following relationship:

$$0.5 \leq d1/d2 \leq 1.5.$$

10. The electronic device as claimed in claim 1, further comprising:

a second conductive pad adjacent to the first conductive pad, wherein the first conductive pad and the second conductive pad are arranged along a first direction, in the first direction, a pitch between the floating pad and the first conductive pad is represented by p1, a pitch between the first conductive pad and the second conductive pad is represented by p2, and p1 and p2 satisfy the following relationship:

$$0.5 \leq p1/p2 \leq 1.5.$$

11. The electronic device as claimed in claim 1, wherein the metal frame comprises a plurality of segments, and the plurality of segments are not connected to each other.

12. The electronic device as claimed in claim 1, wherein a radius of curvature of the arc-shaped edge is between 1 micrometer and 100 micrometers.

13. The electronic device as claimed in claim 1, further comprising:

a dummy conductive pad disposed adjacent to the first conductive pad, wherein the dummy conductive pad does not have an observation region.

14. The electronic device as claimed in claim 1, wherein the metal frame is a hollow structure, and the observation region is a light-transmitting region.

15. The electronic device as claimed in claim 2, wherein the electronic component comprises a bonding pad, and the bonding pad is electrically connected to the first conductive pad through the conductive particle.

16. The electronic device as claimed in claim 1, further comprising:

a second conductive pad adjacent to the first conductive pad;

a second transparent conductive pad disposed on the first conductive pad;

a third conductive pad disposed on the first conductive pad, wherein the second transparent conductive pad is disposed on the third conductive pad; and a first insulating layer and a second insulating layer disposed between the first conductive pad and the second transparent conductive pad, wherein the second transparent conductive pad is electrically connected to the first conductive pad through a via hole of the first insulating layer, and the second transparent conductive pad is electrically connected to the third conductive pad through a via hole of the second insulating layer.

17. The electronic device as claimed in claim 16, wherein an area of the third conductive pad is smaller than an area of the first conductive pad.

18. The electronic device as claimed in claim 16, wherein the first conductive pad and the third conductive pad are electrically connected to each other and transmit the same signal.

19. The electronic device as claimed in claim 16, wherein in the normal direction of the substrate, a depth of the via hole of the second insulating layer is represented by D1', and D1' and H1 satisfy the following relationship:

$$0.3 \leq H1/D1' \leq 1.5.$$

* * * * *